United States Patent
Holman et al.

(10) Patent No.: US 12,406,829 B2
(45) Date of Patent: Sep. 2, 2025

(54) METHODS AND SYSTEMS FOR RECLAMATION OF LI-ION CATHODE MATERIALS USING MICROWAVE PLASMA PROCESSING

(71) Applicant: 6K Inc., North Andover, MA (US)

(72) Inventors: Richard K. Holman, Wellesley, MA (US); Gregory M. Wrobel, West Newbury, MA (US)

(73) Assignee: 6K Inc., North Andover, MA (US)

( * ) Notice: Subject to any disclaimer, the term of this patent is extended or adjusted under 35 U.S.C. 154(b) by 911 days.

(21) Appl. No.: 17/647,422

(22) Filed: Jan. 7, 2022

(65) Prior Publication Data

US 2022/0223379 A1  Jul. 14, 2022

Related U.S. Application Data

(60) Provisional application No. 63/135,948, filed on Jan. 11, 2021.

(51) Int. Cl.
*H01J 37/32* (2006.01)

(52) U.S. Cl.
CPC .... *H01J 37/32201* (2013.01); *H01J 37/3255* (2013.01); *H01J 2237/0817* (2013.01)

(58) Field of Classification Search
CPC ............ H01J 37/32201; H01J 37/3255; H01J 2237/0817; H01J 37/32192; H01M 10/0525; H01M 4/139; H01M 4/0471; H01M 4/1391; H01M 2004/028; H01M 4/0469; H01M 4/525; H01M 4/505; H01M 10/0569; H01M 10/54; C01P 2006/12; C01P 2002/60; C01P 2004/51; C01P 2004/61; C01P 2004/03; C01P 2004/62; C01P 2004/32; C01P 2006/40;
(Continued)

(56) References Cited

U.S. PATENT DOCUMENTS 1,699,205 A  1/1929  Podszus et al.
2,892,215 A  6/1959  Naeser et al.
(Continued)

FOREIGN PATENT DOCUMENTS

AU  2003211869 A1  9/2003
AU  2014394102 B2  6/2020
(Continued)

OTHER PUBLICATIONS

Ajayi, B. P. et al., "Atmospheric plasma spray pyrolysis of lithiated nickel-manganese-cobalt oxides for cathodes in lithium ion batteries", Chemical Engineering Science, vol. 174, Sep. 14, 2017, pp. 302-310.
(Continued)

*Primary Examiner* — Xiuyu Tai
(74) *Attorney, Agent, or Firm* — Knobbe, Martens, Olson & Bear, LLP

(57) ABSTRACT

Disclosed herein are embodiments of systems and methods for recycling used solid feedstocks containing lithium powders for use in lithium-ion batteries. The used solid feedstocks may be Lithium Nickel Manganese Cobalt Oxide (NMC) materials. In some embodiments, the used solid feedstock can undergo a microwave plasma process to produce a newly usable, lithium supplemented solid precursor with augmented chemistries and physical properties.

16 Claims, 4 Drawing Sheets

(58) Field of Classification Search
CPC ....... C01P 2002/72; C01G 53/50; C01G 3/50; C01G 45/1228; C01G 23/005; C01G 25/00; C01G 45/1235; C01G 53/44; C01G 49/0072; C01G 53/42; Y02E 60/10; C07C 53/10; C01D 15/10; G01N 23/20; C01B 25/45; B01D 53/68; B01D 53/78; B01D 2251/604; B01D 2251/304; B01D 2258/06; Y02W 30/84
See application file for complete search history.

(56) References Cited

U.S. PATENT DOCUMENTS

| | | |
|---|---|---|
| 3,010,009 A | 11/1961 | Ducati |
| 3,290,723 A | 12/1966 | Jacques et al. |
| 3,293,334 A | 12/1966 | Bylund et al. |
| 3,434,831 A | 3/1969 | Knopp et al. |
| 3,466,165 A | 9/1969 | Rhys et al. |
| RE26,879 E | 5/1970 | Kelso |
| 3,652,259 A | 3/1972 | Knopp |
| 3,802,816 A | 4/1974 | Kaufmann |
| 3,845,344 A | 10/1974 | Rainer |
| 3,909,241 A | 9/1975 | Cheney et al. |
| 3,966,374 A | 6/1976 | Honnorat et al. |
| 3,974,245 A | 8/1976 | Cheney et al. |
| 4,076,640 A | 2/1978 | Forgensi et al. |
| 4,177,026 A | 12/1979 | Honnorat et al. |
| 4,212,837 A | 7/1980 | Oguchi et al. |
| 4,221,554 A | 9/1980 | Oguchi et al. |
| 4,221,775 A | 9/1980 | Anno |
| 4,265,730 A | 5/1981 | Hirose et al. |
| 4,423,303 A | 12/1983 | Hirose et al. |
| 4,431,449 A | 2/1984 | Dillon et al. |
| 4,439,410 A | 3/1984 | Santen et al. |
| 4,544,404 A | 10/1985 | Yolton et al. |
| 4,569,823 A | 2/1986 | Westin |
| 4,599,880 A | 7/1986 | Stepanenko et al. |
| 4,611,108 A | 9/1986 | Leprince et al. |
| 4,670,047 A | 6/1987 | Kopatz et al. |
| 4,692,584 A | 9/1987 | Caneer, Jr. |
| 4,705,560 A | 11/1987 | Kemp, Jr. et al. |
| 4,711,660 A | 12/1987 | Kemp, Jr. et al. |
| 4,711,661 A | 12/1987 | Kemp, Jr. et al. |
| 4,714,587 A | 12/1987 | Eylon et al. |
| 4,731,110 A | 3/1988 | Kopatz et al. |
| 4,731,111 A | 3/1988 | Kopatz et al. |
| 4,772,315 A | 9/1988 | Johnson et al. |
| 4,778,515 A | 10/1988 | Kemp, Jr. et al. |
| 4,780,131 A | 10/1988 | Kemp, Jr. et al. |
| 4,780,881 A | 10/1988 | Zhang et al. |
| 4,783,216 A | 11/1988 | Kemp, Jr. et al. |
| 4,783,218 A | 11/1988 | Kemp, Jr. et al. |
| 4,787,934 A | 11/1988 | Johnson et al. |
| 4,802,915 A | 2/1989 | Kopatz et al. |
| 4,836,850 A | 6/1989 | Kemp, Jr. et al. |
| 4,859,237 A | 8/1989 | Johnson et al. |
| 4,923,509 A | 5/1990 | Kemp, Jr. et al. |
| 4,923,531 A | 5/1990 | Fisher |
| 4,943,322 A | 7/1990 | Kemp, Jr. et al. |
| 4,944,797 A | 7/1990 | Kemp, Jr. et al. |
| 4,952,389 A | 8/1990 | Szymanski et al. |
| 4,957,062 A | 9/1990 | Schuurmans et al. |
| 5,002,646 A | 3/1991 | Egerton et al. |
| 5,022,935 A | 6/1991 | Fisher |
| 5,032,202 A | 7/1991 | Tsai et al. |
| 5,041,713 A | 8/1991 | Weidman |
| 5,095,048 A | 3/1992 | Takahashi et al. |
| 5,114,471 A | 5/1992 | Johnson et al. |
| 5,126,104 A | 6/1992 | Anand et al. |
| 5,131,992 A | 7/1992 | Church et al. |
| 5,200,595 A | 4/1993 | Boulos et al. |
| 5,234,526 A | 8/1993 | Chen et al. |
| 5,290,507 A | 3/1994 | Runkle |
| 5,292,370 A | 3/1994 | Tsai et al. |
| 5,370,765 A | 12/1994 | Dandl |
| 5,376,475 A | 12/1994 | Ovshinsky et al. |
| 5,395,453 A | 3/1995 | Noda |
| 5,411,592 A | 5/1995 | Ovshinsky et al. |
| 5,431,967 A | 7/1995 | Manthiram et al. |
| 5,518,831 A | 5/1996 | Tou et al. |
| 5,567,243 A | 10/1996 | Foster et al. |
| 5,665,640 A | 9/1997 | Foster et al. |
| 5,671,045 A | 9/1997 | Woskov et al. |
| 5,676,919 A | 10/1997 | Kawamura et al. |
| 5,702,530 A | 12/1997 | Shan et al. |
| 5,750,013 A | 5/1998 | Lin |
| 5,776,323 A | 7/1998 | Kobashi |
| 5,866,213 A | 2/1999 | Foster et al. |
| 5,876,684 A | 3/1999 | Withers et al. |
| 5,909,277 A | 6/1999 | Woskov et al. |
| 5,958,361 A | 9/1999 | Laine et al. |
| 5,969,352 A | 10/1999 | French et al. |
| 5,980,977 A | 11/1999 | Deng et al. |
| 5,989,648 A | 11/1999 | Phillips |
| 6,013,155 A | 1/2000 | McMillin et al. |
| 6,027,585 A | 2/2000 | Patterson et al. |
| 6,200,651 B1 | 3/2001 | Roche et al. |
| 6,221,125 B1 | 4/2001 | Soda et al. |
| 6,261,484 B1 | 7/2001 | Phillips et al. |
| 6,274,110 B1 | 8/2001 | Kim et al. |
| 6,329,628 B1 | 12/2001 | Kuo et al. |
| 6,334,882 B1 | 1/2002 | Aslund |
| 6,362,449 B1 | 3/2002 | Hadidi et al. |
| 6,376,027 B1 | 4/2002 | Lee et al. |
| 6,383,953 B2 | 5/2002 | Hwang |
| 6,409,851 B1 | 6/2002 | Sethuram et al. |
| 6,428,600 B1 | 8/2002 | Flurschutz et al. |
| 6,518,667 B1 | 2/2003 | Ichida et al. |
| 6,543,380 B1 | 4/2003 | Sung-Spritzl |
| 6,551,377 B1 | 4/2003 | Leonhardt |
| 6,558,848 B1 | 5/2003 | Kobayashi et al. |
| 6,569,397 B1 | 5/2003 | Yadav et al. |
| 6,579,573 B2 | 6/2003 | Strutt et al. |
| 6,589,311 B1 | 7/2003 | Han et al. |
| 6,607,693 B1 | 8/2003 | Saito et al. |
| 6,652,822 B2 | 11/2003 | Phillips et al. |
| 6,676,728 B2 | 1/2004 | Han et al. |
| 6,689,192 B1 | 2/2004 | Phillips et al. |
| 6,752,979 B1 | 6/2004 | Talbot et al. |
| 6,755,886 B2 | 6/2004 | Phillips et al. |
| 6,780,219 B2 | 8/2004 | Singh et al. |
| 6,793,849 B1 | 9/2004 | Gruen et al. |
| 6,805,822 B2 | 10/2004 | Takei et al. |
| 6,832,735 B2 | 12/2004 | Yadav et al. |
| 6,838,072 B1 | 1/2005 | Kong et al. |
| 6,869,550 B2 | 3/2005 | Dorfman et al. |
| 6,902,745 B2 | 6/2005 | Lee et al. |
| 6,919,257 B2 | 7/2005 | Gealy et al. |
| 6,919,527 B2 | 7/2005 | Boulos et al. |
| 6,989,529 B2 | 1/2006 | Wiseman |
| 7,066,980 B2 | 6/2006 | Akimoto et al. |
| 7,091,441 B1 | 8/2006 | Kuo |
| 7,108,733 B2 | 9/2006 | Enokido |
| 7,125,537 B2 | 10/2006 | Liao et al. |
| 7,125,822 B2 | 10/2006 | Nakano et al. |
| 7,175,786 B2 | 2/2007 | Celikkaya et al. |
| 7,182,929 B1 | 2/2007 | Singhal et al. |
| 7,220,398 B2 | 5/2007 | Sutorik et al. |
| 7,235,118 B2 | 6/2007 | Bouaricha et al. |
| 7,285,194 B2 | 10/2007 | Uno et al. |
| 7,285,307 B2 | 10/2007 | Hohenthanner et al. |
| 7,297,310 B1 | 11/2007 | Peng et al. |
| 7,297,892 B2 | 11/2007 | Kelley et al. |
| 7,344,776 B2 | 3/2008 | Kollmann et al. |
| 7,357,910 B2 | 4/2008 | Phillips et al. |
| 7,368,130 B2 | 5/2008 | Kim et al. |
| 7,374,704 B2 | 5/2008 | Che et al. |
| 7,375,303 B2 | 5/2008 | Twarog |
| 7,381,496 B2 | 6/2008 | Onnerud et al. |
| 7,431,750 B2 | 10/2008 | Liao et al. |
| 7,442,271 B2 | 10/2008 | Asmussen et al. |
| 7,491,468 B2 | 2/2009 | Okada et al. |
| 7,517,513 B2 | 4/2009 | Sarkas et al. |
| 7,524,353 B2 | 4/2009 | Johnson, Jr. et al. |

(56) References Cited

U.S. PATENT DOCUMENTS

| | | |
|---|---|---|
| 7,534,296 B2 | 5/2009 | Swain et al. |
| 7,572,315 B2 | 8/2009 | Boulos et al. |
| 7,622,211 B2 | 11/2009 | Vyas et al. |
| 7,629,553 B2 | 12/2009 | Fanson et al. |
| 7,700,152 B2 | 4/2010 | Laine et al. |
| 7,776,303 B2 | 8/2010 | Hung et al. |
| 7,806,077 B2 | 10/2010 | Lee et al. |
| 7,828,999 B2 | 11/2010 | Yubuta et al. |
| 7,901,658 B2 | 3/2011 | Weppner et al. |
| 7,931,836 B2 | 4/2011 | Xie et al. |
| 7,939,141 B2 | 5/2011 | Matthews et al. |
| 8,007,691 B2 | 8/2011 | Sawaki et al. |
| 8,043,405 B2 | 10/2011 | Johnson, Jr. et al. |
| 8,092,941 B2 | 1/2012 | Weppner et al. |
| 8,101,061 B2 | 1/2012 | Suh et al. |
| 8,168,128 B2 | 5/2012 | Seeley et al. |
| 8,178,240 B2 | 5/2012 | Wang et al. |
| 8,192,865 B2 | 6/2012 | Buiel et al. |
| 8,193,291 B2 | 6/2012 | Zhang |
| 8,211,388 B2 | 7/2012 | Woodfield et al. |
| 8,221,853 B2 | 7/2012 | Marcinek et al. |
| 8,268,230 B2 | 9/2012 | Cherepy et al. |
| 8,283,275 B2 | 10/2012 | Heo et al. |
| 8,303,926 B1 | 11/2012 | Luhrs et al. |
| 8,329,090 B2 | 12/2012 | Hollingsworth et al. |
| 8,329,257 B2 | 12/2012 | Larouche et al. |
| 8,338,323 B2 | 12/2012 | Takasu et al. |
| 8,389,160 B2 | 3/2013 | Venkatachalam et al. |
| 8,420,043 B2 | 4/2013 | Gamo et al. |
| 8,439,998 B2 | 5/2013 | Ito et al. |
| 8,449,950 B2 | 5/2013 | Shang et al. |
| 8,478,785 B2 | 7/2013 | Jamjoom et al. |
| 8,492,303 B2 | 7/2013 | Bulan et al. |
| 8,529,996 B2 | 9/2013 | Bocian et al. |
| 8,592,767 B2 | 11/2013 | Rappe et al. |
| 8,597,722 B2 | 12/2013 | Albano et al. |
| 8,623,555 B2 | 1/2014 | Kang et al. |
| 8,658,317 B2 | 2/2014 | Weppner et al. |
| 8,685,593 B2 | 4/2014 | Dadheech et al. |
| 8,728,680 B2 | 5/2014 | Mikhail et al. |
| 8,735,022 B2 | 5/2014 | Schlag et al. |
| 8,748,785 B2 | 6/2014 | Jordan et al. |
| 8,758,957 B2 | 6/2014 | Dadheech et al. |
| 8,784,706 B2 | 7/2014 | Shevchenko et al. |
| 8,822,000 B2 | 9/2014 | Kumagai et al. |
| 8,840,701 B2 | 9/2014 | Borland et al. |
| 8,877,119 B2 | 11/2014 | Jordan et al. |
| 8,882,007 B1 * | 11/2014 | Smith .................. H01M 10/54 241/23 |
| 8,911,529 B2 | 12/2014 | Withers et al. |
| 8,919,428 B2 | 12/2014 | Cola et al. |
| 8,945,431 B2 | 2/2015 | Schulz et al. |
| 8,951,496 B2 | 2/2015 | Hadidi et al. |
| 8,956,785 B2 | 2/2015 | Dadheech et al. |
| 8,968,587 B2 | 3/2015 | Shin et al. |
| 8,968,669 B2 | 3/2015 | Chen |
| 8,980,485 B2 | 3/2015 | Lanning et al. |
| 8,999,440 B2 | 4/2015 | Zenasni et al. |
| 9,023,259 B2 | 5/2015 | Hadidi et al. |
| 9,051,647 B2 | 6/2015 | Cooperberg et al. |
| 9,065,141 B2 | 6/2015 | Merzougui et al. |
| 9,067,264 B2 | 6/2015 | Moxson et al. |
| 9,079,778 B2 | 7/2015 | Kelley et al. |
| 9,085,490 B2 | 7/2015 | Taylor et al. |
| 9,101,982 B2 | 8/2015 | Aslund |
| 9,136,569 B2 | 9/2015 | Song et al. |
| 9,150,422 B2 | 10/2015 | Nakayama et al. |
| 9,193,133 B2 | 11/2015 | Shin et al. |
| 9,196,901 B2 | 11/2015 | Se-Hee et al. |
| 9,196,905 B2 | 11/2015 | Tzeng et al. |
| 9,206,085 B2 | 12/2015 | Hadidi et al. |
| 9,242,224 B2 | 1/2016 | Redjdal et al. |
| 9,259,785 B2 | 2/2016 | Hadidi et al. |
| 9,293,302 B2 | 3/2016 | Risby et al. |
| 9,321,071 B2 | 4/2016 | Jordan et al. |
| 9,322,081 B2 | 4/2016 | McHugh et al. |
| 9,352,278 B2 | 5/2016 | Spatz et al. |
| 9,356,281 B2 | 5/2016 | Verbrugge et al. |
| 9,368,772 B1 | 6/2016 | Chen et al. |
| 9,378,928 B2 | 6/2016 | Zeng et al. |
| 9,412,998 B2 | 8/2016 | Rojeski et al. |
| 9,421,612 B2 | 8/2016 | Fang et al. |
| 9,425,463 B2 | 8/2016 | Hsu et al. |
| 9,463,435 B2 | 10/2016 | Schulz et al. |
| 9,463,984 B2 | 10/2016 | Sun et al. |
| 9,520,593 B2 | 12/2016 | Sun et al. |
| 9,520,600 B2 | 12/2016 | Dadheech et al. |
| 9,624,565 B2 | 4/2017 | Lee et al. |
| 9,627,150 B2 | 4/2017 | Sasaki et al. |
| 9,630,162 B1 | 4/2017 | Sunkara et al. |
| 9,643,891 B2 | 5/2017 | Hadidi et al. |
| 9,700,877 B2 | 7/2017 | Kim et al. |
| 9,705,136 B2 | 7/2017 | Rojeski |
| 9,718,131 B2 | 8/2017 | Boulos et al. |
| 9,735,427 B2 | 8/2017 | Zhang |
| 9,738,788 B1 | 8/2017 | Gross et al. |
| 9,751,129 B2 | 9/2017 | Boulos et al. |
| 9,767,990 B2 | 9/2017 | Zeng et al. |
| 9,768,033 B2 | 9/2017 | Ranjan et al. |
| 9,776,378 B2 | 10/2017 | Choi |
| 9,782,791 B2 | 10/2017 | Redjdal et al. |
| 9,782,828 B2 | 10/2017 | Wilkinson |
| 9,796,019 B2 | 10/2017 | She et al. |
| 9,796,020 B2 | 10/2017 | Aslund |
| 9,831,503 B2 | 11/2017 | Sopchak |
| 9,871,248 B2 | 1/2018 | Rayner et al. |
| 9,879,344 B2 | 1/2018 | Lee et al. |
| 9,899,674 B2 | 2/2018 | Hirai et al. |
| 9,917,299 B2 | 3/2018 | Behan et al. |
| 9,932,673 B2 | 4/2018 | Jordan et al. |
| 9,945,034 B2 | 4/2018 | Yao et al. |
| 9,945,564 B2 | 4/2018 | Gao et al. |
| 9,947,926 B2 | 4/2018 | Kim et al. |
| 9,981,284 B2 | 5/2018 | Guo et al. |
| 9,991,458 B2 | 6/2018 | Rosenman et al. |
| 9,999,922 B1 | 6/2018 | Struve |
| 10,011,491 B2 | 7/2018 | Lee et al. |
| 10,050,303 B2 | 8/2018 | Anandan et al. |
| 10,057,986 B2 | 8/2018 | Prud'Homme et al. |
| 10,065,240 B2 | 9/2018 | Chen |
| 10,079,392 B2 | 9/2018 | Huang et al. |
| 10,116,000 B1 | 10/2018 | Federici et al. |
| 10,130,994 B2 | 11/2018 | Fang et al. |
| 10,167,556 B2 | 1/2019 | Ruzic et al. |
| 10,170,753 B2 | 1/2019 | Ren et al. |
| 10,193,142 B2 | 1/2019 | Rojeski |
| 10,244,614 B2 | 3/2019 | Foret |
| 10,279,531 B2 | 5/2019 | Pagliarini |
| 10,283,757 B2 | 5/2019 | Noh et al. |
| 10,319,537 B2 | 6/2019 | Claussen et al. |
| 10,333,183 B2 | 6/2019 | Sloop |
| 10,350,680 B2 | 7/2019 | Yamamoto et al. |
| 10,403,475 B2 | 9/2019 | Cooperberg et al. |
| 10,411,253 B2 | 9/2019 | Tzeng et al. |
| 10,439,206 B2 | 10/2019 | Behan et al. |
| 10,442,000 B2 | 10/2019 | Fukada et al. |
| 10,461,298 B2 | 10/2019 | Herle |
| 10,472,497 B2 | 11/2019 | Stowell et al. |
| 10,477,665 B2 | 11/2019 | Hadidi |
| 10,493,524 B2 | 12/2019 | She et al. |
| 10,522,300 B2 | 12/2019 | Yang |
| 10,526,684 B2 | 1/2020 | Ekman et al. |
| 10,529,486 B2 | 1/2020 | Nishisaka |
| 10,543,534 B2 | 1/2020 | Hadidi et al. |
| 10,584,923 B2 | 3/2020 | De et al. |
| 10,593,985 B2 | 3/2020 | Sastry et al. |
| 10,610,929 B2 | 4/2020 | Fang et al. |
| 10,637,029 B2 | 4/2020 | Gotlib Vainshtein et al. |
| 10,638,592 B2 | 4/2020 | Foret |
| 10,639,712 B2 | 5/2020 | Barnes et al. |
| 10,647,824 B2 | 5/2020 | Hwang et al. |
| 10,655,206 B2 | 5/2020 | Moon et al. |
| 10,665,890 B2 | 5/2020 | Kang et al. |
| 10,668,566 B2 | 6/2020 | Smathers et al. |

(56) References Cited

U.S. PATENT DOCUMENTS

| | | |
|---|---|---|
| 10,669,437 B2 | 6/2020 | Cox et al. |
| 10,688,564 B2 | 6/2020 | Boulos et al. |
| 10,707,477 B2 | 7/2020 | Sastry et al. |
| 10,717,150 B2 | 7/2020 | Aleksandrov et al. |
| 10,727,477 B2 | 7/2020 | Kim et al. |
| 10,741,845 B2 | 8/2020 | Yushin et al. |
| 10,744,590 B2 | 8/2020 | Maier et al. |
| 10,756,334 B2 | 8/2020 | Stowell et al. |
| 10,766,787 B1 | 9/2020 | Sunkara et al. |
| 10,777,804 B2 | 9/2020 | Sastry et al. |
| 10,781,103 B2 | 9/2020 | Tanner et al. |
| 10,843,925 B1 | 11/2020 | Kroeger et al. |
| 10,858,255 B2 | 12/2020 | Koziol et al. |
| 10,858,500 B2 | 12/2020 | Chen et al. |
| 10,892,477 B2 | 1/2021 | Choi et al. |
| 10,930,473 B2 | 2/2021 | Paukner et al. |
| 10,930,922 B2 | 2/2021 | Sun et al. |
| 10,937,632 B2 | 3/2021 | Stowell et al. |
| 10,943,744 B2 | 3/2021 | Sungail et al. |
| 10,944,093 B2 | 3/2021 | Paz et al. |
| 10,950,856 B2 | 3/2021 | Park et al. |
| 10,964,938 B2 | 3/2021 | Rojeski |
| 10,987,735 B2 | 4/2021 | Hadidi et al. |
| 10,998,552 B2 | 5/2021 | Lanning et al. |
| 11,011,388 B2 | 5/2021 | Eason et al. |
| 11,031,641 B2 | 6/2021 | Gupta et al. |
| 11,050,061 B2 | 6/2021 | Kim et al. |
| 11,072,533 B2 | 7/2021 | Shevchenko et al. |
| 11,077,497 B2 | 8/2021 | Motchenbacher et al. |
| 11,077,524 B2 | 8/2021 | Smathers et al. |
| 11,108,050 B2 | 8/2021 | Kim et al. |
| 11,116,000 B2 | 9/2021 | Sandberg et al. |
| 11,130,175 B2 | 9/2021 | Parrish et al. |
| 11,130,994 B2 | 9/2021 | Shachar et al. |
| 11,133,495 B2 | 9/2021 | Gazda et al. |
| 11,148,202 B2 | 10/2021 | Hadidi et al. |
| 11,167,556 B2 | 11/2021 | Shimada et al. |
| 11,170,753 B2 | 11/2021 | Nomura et al. |
| 11,171,322 B2 | 11/2021 | Seol et al. |
| 11,183,682 B2 | 11/2021 | Sunkara et al. |
| 11,193,142 B2 | 12/2021 | Angelidaki et al. |
| 11,196,045 B2 | 12/2021 | Dadheech et al. |
| 11,219,884 B2 | 1/2022 | Takeda et al. |
| 11,235,385 B2 | 2/2022 | Larouche et al. |
| 11,244,614 B2 | 2/2022 | He et al. |
| 11,245,065 B1 | 2/2022 | Ouderkirk et al. |
| 11,245,109 B2 | 2/2022 | Tzeng et al. |
| 11,254,585 B2 | 2/2022 | Ekman et al. |
| 11,273,322 B2 | 3/2022 | Zanata et al. |
| 11,273,491 B2 | 3/2022 | Barnes et al. |
| 11,299,397 B2 | 4/2022 | Lanning et al. |
| 11,311,937 B2 | 4/2022 | Hadidi et al. |
| 11,311,938 B2 | 4/2022 | Badwe et al. |
| 11,319,537 B2 | 5/2022 | Dames et al. |
| 11,333,183 B2 | 5/2022 | Desai et al. |
| 11,335,911 B2 | 5/2022 | Lanning et al. |
| 11,350,680 B2 | 6/2022 | Rutkoski et al. |
| 11,411,253 B2 | 8/2022 | Busacca et al. |
| 11,433,369 B1 | 9/2022 | Nicole et al. |
| 11,439,206 B2 | 9/2022 | Santos |
| 11,442,000 B2 | 9/2022 | Vaez-Iravani et al. |
| 11,461,298 B1 | 10/2022 | Shemmer et al. |
| 11,462,728 B2 | 10/2022 | Stowell et al. |
| 11,465,201 B2 | 10/2022 | Barnes et al. |
| 11,471,941 B2 | 10/2022 | Barnet et al. |
| 11,477,665 B2 | 10/2022 | Franke et al. |
| 11,479,674 B2 | 10/2022 | Nakamura et al. |
| 11,577,314 B2 | 2/2023 | Hadidi et al. |
| 11,590,568 B2 | 2/2023 | Badwe et al. |
| 11,611,130 B2 | 3/2023 | Wrobel et al. |
| 11,633,785 B2 | 4/2023 | Badwe et al. |
| 11,654,483 B2 | 5/2023 | Larouche et al. |
| 11,717,886 B2 | 8/2023 | Badwe et al. |
| 11,839,919 B2 | 12/2023 | Hadidi et al. |
| 11,855,278 B2 | 12/2023 | Holman et al. |
| 11,919,071 B2 | 3/2024 | Badwe et al. |
| 11,923,176 B2 | 3/2024 | Stowell et al. |
| 11,963,287 B2 | 4/2024 | Shang et al. |
| 12,040,162 B2 | 7/2024 | Kozlowski et al. |
| 12,042,861 B2 | 7/2024 | Badwe |
| 12,094,688 B2 | 9/2024 | Kozlowski et al. |
| 12,176,529 B2 | 12/2024 | Holman et al. |
| 12,214,420 B2 | 2/2025 | Hadidi et al. |
| 12,261,023 B2 | 3/2025 | Holman et al. |
| 2001/0016283 A1 | 8/2001 | Shiraishi et al. |
| 2001/0021740 A1 | 9/2001 | Lodyga et al. |
| 2002/0054912 A1 | 5/2002 | Kim et al. |
| 2002/0112794 A1 | 8/2002 | Sethuram et al. |
| 2003/0024806 A1 | 2/2003 | Foret |
| 2003/0027021 A1 | 2/2003 | Sharivker et al. |
| 2003/0070620 A1 | 4/2003 | Cooperberg et al. |
| 2003/0129497 A1 | 7/2003 | Yamamoto et al. |
| 2003/0172772 A1 | 9/2003 | Sethuram et al. |
| 2003/0186128 A1 | 10/2003 | Singh et al. |
| 2003/0207978 A1 | 11/2003 | Yadav et al. |
| 2004/0013941 A1 | 1/2004 | Kobayashi et al. |
| 2004/0045807 A1 | 3/2004 | Sarkas et al. |
| 2004/0060387 A1 | 4/2004 | Tanner-Jones |
| 2004/0123699 A1 | 7/2004 | Liao et al. |
| 2004/0247522 A1 | 12/2004 | Mills |
| 2005/0005844 A1 | 1/2005 | Kitagawa et al. |
| 2005/0025698 A1 | 2/2005 | Talbot et al. |
| 2005/0072496 A1 | 4/2005 | Hwang et al. |
| 2005/0163696 A1 | 7/2005 | Uhm et al. |
| 2005/0242070 A1 | 11/2005 | Hammer |
| 2005/0260786 A1 | 11/2005 | Yoshikawa et al. |
| 2006/0040168 A1 | 2/2006 | Sridhar |
| 2006/0040182 A1 | 2/2006 | Kawakami et al. |
| 2006/0045822 A1 | 3/2006 | Timmons et al. |
| 2006/0069176 A1 | 3/2006 | Bowman et al. |
| 2006/0106146 A1 | 5/2006 | Xia et al. |
| 2006/0141153 A1 | 6/2006 | Kubota et al. |
| 2006/0145124 A1 | 7/2006 | Hsiao et al. |
| 2006/0291827 A1 | 12/2006 | Suib et al. |
| 2007/0077350 A1 | 4/2007 | Hohenthanner et al. |
| 2007/0089860 A1 | 4/2007 | Hou et al. |
| 2007/0092432 A1 | 4/2007 | Prud et al. |
| 2007/0209758 A1 | 9/2007 | Sompalli et al. |
| 2007/0221635 A1 | 9/2007 | Boulos et al. |
| 2007/0259768 A1 | 11/2007 | Kear et al. |
| 2008/0029485 A1 | 2/2008 | Kelley et al. |
| 2008/0055594 A1 | 3/2008 | Hadidi et al. |
| 2008/0153962 A1 | 6/2008 | Xia et al. |
| 2008/0182114 A1 | 7/2008 | Kim et al. |
| 2008/0220244 A1 | 9/2008 | Wai et al. |
| 2008/0286490 A1 | 11/2008 | Bogdanoff et al. |
| 2008/0296268 A1 | 12/2008 | Mike et al. |
| 2008/0305025 A1 | 12/2008 | Vitner et al. |
| 2009/0061322 A1 | 3/2009 | Kawakami et al. |
| 2009/0074655 A1 | 3/2009 | Suciu |
| 2009/0093553 A1 | 4/2009 | Jager et al. |
| 2009/0155689 A1 | 6/2009 | Zaghib et al. |
| 2009/0176034 A1 | 7/2009 | Ruuttu et al. |
| 2009/0196801 A1 | 8/2009 | Mills |
| 2009/0202869 A1 | 8/2009 | Sawaki et al. |
| 2009/0246398 A1 | 10/2009 | Kurahashi et al. |
| 2009/0258255 A1 | 10/2009 | Terashima et al. |
| 2009/0266487 A1 | 10/2009 | Tian et al. |
| 2009/0304941 A1 | 12/2009 | McLean |
| 2009/0305132 A1 | 12/2009 | Gauthier et al. |
| 2010/0007162 A1 | 1/2010 | Han et al. |
| 2010/0096362 A1 | 4/2010 | Hirayama et al. |
| 2010/0173098 A1 | 7/2010 | Nagata et al. |
| 2010/0176524 A1 | 7/2010 | Burgess et al. |
| 2010/0219062 A1 | 9/2010 | Leon Sanchez |
| 2010/0301212 A1 | 12/2010 | Dato et al. |
| 2010/0320176 A1 | 12/2010 | Mohanty et al. |
| 2011/0005461 A1 | 1/2011 | Vandermeulen |
| 2011/0006254 A1 | 1/2011 | Richard et al. |
| 2012/0015284 A1 | 1/2012 | Merzougui et al. |
| 2012/0027955 A1 | 2/2012 | Sunkara et al. |
| 2012/0034135 A1 | 2/2012 | Risby |
| 2012/0048064 A1 | 3/2012 | Kasper et al. |
| 2012/0051962 A1 | 3/2012 | Imam et al. |

(56) References Cited

U.S. PATENT DOCUMENTS

| | | |
|---|---|---|
| 2012/0074342 A1 | 3/2012 | Kim et al. |
| 2012/0100438 A1 | 4/2012 | Fasching et al. |
| 2012/0112379 A1 | 5/2012 | Beppu et al. |
| 2012/0122017 A1 | 5/2012 | Mills |
| 2012/0224175 A1 | 9/2012 | Minghetti |
| 2012/0230860 A1 | 9/2012 | Ward-Close et al. |
| 2012/0240726 A1 | 9/2012 | Kim et al. |
| 2012/0294919 A1 | 11/2012 | Jaynes et al. |
| 2013/0032753 A1 | 2/2013 | Yamamoto et al. |
| 2013/0071284 A1 | 3/2013 | Kano et al. |
| 2013/0075390 A1 | 3/2013 | Ashida |
| 2013/0078508 A1 | 3/2013 | Tolbert et al. |
| 2013/0084474 A1 | 4/2013 | Mills |
| 2013/0087285 A1 | 4/2013 | Kofuji et al. |
| 2014/0048516 A1 | 2/2014 | Gorodetsky et al. |
| 2014/0202286 A1 | 7/2014 | Yokoyama et al. |
| 2014/0271843 A1 | 9/2014 | Ma et al. |
| 2014/0272430 A1 | 9/2014 | Kalayaraman |
| 2014/0322632 A1 | 10/2014 | Sugimoto et al. |
| 2014/0373344 A1 | 12/2014 | Takada et al. |
| 2015/0000844 A1 | 1/2015 | Woo |
| 2015/0101454 A1 | 4/2015 | Shimizu et al. |
| 2015/0167143 A1 | 6/2015 | Luce et al. |
| 2015/0171455 A1 | 6/2015 | Mills |
| 2015/0255767 A1 | 9/2015 | Aetukuri et al. |
| 2015/0259220 A1 | 9/2015 | Rosocha et al. |
| 2015/0270106 A1 | 9/2015 | Kobayashi et al. |
| 2015/0274569 A1 | 10/2015 | Boughton |
| 2015/0333307 A1 | 11/2015 | Thokchom et al. |
| 2015/0342491 A1 | 12/2015 | Marecki et al. |
| 2015/0351652 A1 | 12/2015 | Marecki et al. |
| 2016/0028088 A1 | 1/2016 | Romeo et al. |
| 2016/0030359 A1 | 2/2016 | Ma et al. |
| 2016/0045841 A1 | 2/2016 | Kaplan et al. |
| 2016/0152480 A1 | 6/2016 | Jang et al. |
| 2016/0172163 A1 | 6/2016 | Kaneko et al. |
| 2016/0175929 A1 | 6/2016 | Colin et al. |
| 2016/0189933 A1 | 6/2016 | Kobayashi et al. |
| 2016/0197341 A1 | 7/2016 | Lu et al. |
| 2016/0254540 A1 | 9/2016 | Lee et al. |
| 2016/0284519 A1 | 9/2016 | Kobayashi et al. |
| 2016/0285090 A1 | 9/2016 | Ozkan et al. |
| 2016/0287113 A1 | 10/2016 | Hebert et al. |
| 2016/0308244 A1 | 10/2016 | Badding et al. |
| 2016/0332232 A1 | 11/2016 | Forbes Jones et al. |
| 2016/0351910 A1 | 12/2016 | Albano et al. |
| 2016/0358757 A1 | 12/2016 | Ikeda et al. |
| 2017/0009328 A1 | 1/2017 | Germann et al. |
| 2017/0070180 A1 | 3/2017 | Mills |
| 2017/0101584 A1 | 4/2017 | Skoptsov et al. |
| 2017/0113935 A1 | 4/2017 | Pennington et al. |
| 2017/0120339 A1 | 5/2017 | Aslund |
| 2017/0125842 A1 | 5/2017 | Meguro et al. |
| 2017/0151609 A1 | 6/2017 | Elsen et al. |
| 2017/0176977 A1 | 6/2017 | Huang et al. |
| 2017/0179477 A1 | 6/2017 | Walters et al. |
| 2017/0200989 A1* | 7/2017 | Sloop ............... H01M 4/136 |
| 2017/0209922 A1 | 7/2017 | Kato et al. |
| 2017/0338464 A1 | 11/2017 | Fasching et al. |
| 2017/0368604 A1 | 12/2017 | Wilkinson |
| 2017/0373344 A1* | 12/2017 | Hadidi ............... C01G 53/50 |
| 2018/0022928 A1 | 1/2018 | Blush |
| 2018/0025794 A1 | 1/2018 | Lahoda et al. |
| 2018/0083264 A1 | 3/2018 | Soppe |
| 2018/0104745 A1 | 4/2018 | L'Esperance et al. |
| 2018/0114677 A1 | 4/2018 | Komatsu et al. |
| 2018/0123121 A1 | 5/2018 | Buchkremer et al. |
| 2018/0130638 A1 | 5/2018 | Ahmad et al. |
| 2018/0134629 A1 | 5/2018 | Kolios et al. |
| 2018/0138018 A1 | 5/2018 | Voronin et al. |
| 2018/0159178 A1 | 6/2018 | Weisenstein et al. |
| 2018/0169763 A1 | 6/2018 | Dorval et al. |
| 2018/0205122 A1* | 7/2018 | Gupta ............... C01G 51/04 |
| 2018/0214956 A1 | 8/2018 | Larouche et al. |
| 2018/0218883 A1 | 8/2018 | Iwao |
| 2018/0241956 A1 | 8/2018 | Suzuki |
| 2018/0248175 A1 | 8/2018 | Ghezelbash et al. |
| 2018/0277826 A1 | 9/2018 | Gayden et al. |
| 2018/0277849 A1 | 9/2018 | Gayden |
| 2018/0294143 A1 | 10/2018 | Chua et al. |
| 2018/0346344 A1 | 12/2018 | Chen et al. |
| 2018/0353643 A1 | 12/2018 | Ma et al. |
| 2018/0363104 A1 | 12/2018 | Fujieda et al. |
| 2018/0366707 A1 | 12/2018 | Johnson et al. |
| 2018/0375149 A1 | 12/2018 | Beck et al. |
| 2019/0001416 A1 | 1/2019 | Larouche et al. |
| 2019/0061005 A1 | 2/2019 | Kelkar |
| 2019/0069944 A1 | 3/2019 | Fischer |
| 2019/0084290 A1 | 3/2019 | Stoyanov et al. |
| 2019/0088993 A1 | 3/2019 | Ohta |
| 2019/0109317 A1 | 4/2019 | Zhou et al. |
| 2019/0125842 A1 | 5/2019 | Grabowski |
| 2019/0127835 A1 | 5/2019 | Yang et al. |
| 2019/0157045 A1 | 5/2019 | Meloni |
| 2019/0160528 A1 | 5/2019 | McGee et al. |
| 2019/0165413 A1 | 5/2019 | Furusawa |
| 2019/0173130 A1 | 6/2019 | Schuhmacher et al. |
| 2019/0193151 A1 | 6/2019 | Okumura et al. |
| 2019/0218650 A1 | 7/2019 | Subramanian et al. |
| 2019/0271068 A1 | 9/2019 | Sungail et al. |
| 2019/0292441 A1 | 9/2019 | Hill et al. |
| 2019/0334206 A1 | 10/2019 | Sastry et al. |
| 2019/0341650 A9 | 11/2019 | Lanning et al. |
| 2019/0348202 A1 | 11/2019 | Sachdev et al. |
| 2019/0362936 A1 | 11/2019 | Van Den Berg et al. |
| 2019/0389734 A1 | 12/2019 | Dietz et al. |
| 2020/0028164 A1 | 1/2020 | Ay et al. |
| 2020/0067128 A1 | 2/2020 | Chmiola et al. |
| 2020/0136176 A1 | 4/2020 | Chen |
| 2020/0149146 A1 | 5/2020 | Chen et al. |
| 2020/0153037 A1 | 5/2020 | Renna et al. |
| 2020/0187607 A1 | 6/2020 | Law |
| 2020/0198977 A1 | 6/2020 | Hof et al. |
| 2020/0203706 A1 | 6/2020 | Holman et al. |
| 2020/0207668 A1 | 7/2020 | Cavalli et al. |
| 2020/0215606 A1 | 7/2020 | Barnes et al. |
| 2020/0215607 A1 | 7/2020 | Miko et al. |
| 2020/0220222 A1 | 7/2020 | Watarai et al. |
| 2020/0223704 A1 | 7/2020 | Neale et al. |
| 2020/0227728 A1 | 7/2020 | Huang et al. |
| 2020/0254432 A1 | 8/2020 | Shirman et al. |
| 2020/0263274 A1 | 8/2020 | Takizawa et al. |
| 2020/0276638 A1 | 9/2020 | King et al. |
| 2020/0288561 A1 | 9/2020 | Huh |
| 2020/0314991 A1 | 10/2020 | Duanmu et al. |
| 2020/0335754 A1 | 10/2020 | Ramasubramanian et al. |
| 2020/0335781 A1 | 10/2020 | Oshita et al. |
| 2020/0346287 A1 | 11/2020 | Badwe et al. |
| 2020/0350542 A1 | 11/2020 | Wrobel et al. |
| 2020/0350565 A1 | 11/2020 | Oshita et al. |
| 2020/0358093 A1 | 11/2020 | Oshita et al. |
| 2020/0358096 A1 | 11/2020 | Paulsen et al. |
| 2020/0381217 A1 | 12/2020 | Kraus et al. |
| 2020/0388857 A1 | 12/2020 | Sunkara et al. |
| 2020/0391295 A1 | 12/2020 | Dorval Dion et al. |
| 2020/0395607 A1 | 12/2020 | Tzeng |
| 2020/0403236 A1 | 12/2020 | Colwell |
| 2020/0407858 A1 | 12/2020 | Sano et al. |
| 2021/0002759 A1 | 1/2021 | Zhang et al. |
| 2021/0024358 A1 | 1/2021 | Chae et al. |
| 2021/0024423 A1 | 1/2021 | Nakamura et al. |
| 2021/0032552 A1 | 2/2021 | Mooney |
| 2021/0047186 A1 | 2/2021 | Ifuku et al. |
| 2021/0057191 A1 | 2/2021 | Stowell et al. |
| 2021/0075000 A1 | 3/2021 | Holman et al. |
| 2021/0078072 A1 | 3/2021 | Barnes et al. |
| 2021/0085468 A1 | 3/2021 | Ryd et al. |
| 2021/0087404 A1 | 3/2021 | Watanabe et al. |
| 2021/0098826 A1 | 4/2021 | Chung et al. |
| 2021/0129216 A1 | 5/2021 | Barnes et al. |
| 2021/0139331 A1 | 5/2021 | Kang et al. |
| 2021/0146432 A1 | 5/2021 | Badwe et al. |
| 2021/0187607 A1 | 6/2021 | Badwe et al. |
| 2021/0187614 A1 | 6/2021 | Tsubota et al. |

(56) References Cited

U.S. PATENT DOCUMENTS

| | | |
|---|---|---|
| 2021/0226195 A1 | 7/2021 | Stowell et al. |
| 2021/0226302 A1 | 7/2021 | Lanning et al. |
| 2021/0229061 A1 | 7/2021 | Stowell et al. |
| 2021/0252599 A1 | 8/2021 | Hadidi et al. |
| 2021/0253430 A1 | 8/2021 | Zaplotnik et al. |
| 2021/0273217 A1 | 9/2021 | Park et al. |
| 2021/0273292 A1 | 9/2021 | Yun et al. |
| 2021/0276094 A1 | 9/2021 | Sobu et al. |
| 2021/0296731 A1 | 9/2021 | Wrobel et al. |
| 2021/0310110 A1 | 10/2021 | Stowell et al. |
| 2021/0339313 A1 | 11/2021 | Motchenbacher et al. |
| 2021/0344059 A1 | 11/2021 | Ekman et al. |
| 2021/0367264 A1 | 11/2021 | Hadidi et al. |
| 2021/0408533 A1 | 12/2021 | Holman et al. |
| 2022/0041457 A1 | 2/2022 | Pullen et al. |
| 2022/0063012 A1 | 3/2022 | Murata et al. |
| 2022/0095445 A1 | 3/2022 | Shang et al. |
| 2022/0118517 A1 | 4/2022 | Hadidi et al. |
| 2022/0119290 A1 | 4/2022 | Fraser et al. |
| 2022/0127145 A1 | 4/2022 | Ding et al. |
| 2022/0134430 A1 | 5/2022 | Larouche et al. |
| 2022/0134431 A1 | 5/2022 | Badwe et al. |
| 2022/0143693 A1 | 5/2022 | Larouche et al. |
| 2022/0209298 A1 | 6/2022 | Kim et al. |
| 2022/0228288 A1 | 7/2022 | Holman et al. |
| 2022/0267216 A1 | 8/2022 | Holman et al. |
| 2022/0288685 A1 | 9/2022 | Badwe |
| 2022/0314325 A1 | 10/2022 | Badwe et al. |
| 2022/0324022 A1 | 10/2022 | Badwe et al. |
| 2022/0352549 A1 | 11/2022 | Kim et al. |
| 2023/0001375 A1 | 1/2023 | Kozlowski et al. |
| 2023/0001376 A1 | 1/2023 | Kozlowski et al. |
| 2023/0025008 A1 | 1/2023 | Lee et al. |
| 2023/0032362 A1 | 2/2023 | Holman et al. |
| 2023/0046882 A1 | 2/2023 | Anderson et al. |
| 2023/0100863 A1 | 3/2023 | Lianto et al. |
| 2023/0143022 A1 | 5/2023 | Mills |
| 2023/0144075 A1 | 5/2023 | Badwe et al. |
| 2023/0219134 A1 | 7/2023 | Houshmand et al. |
| 2023/0245896 A1 | 8/2023 | Gupta et al. |
| 2023/0247751 A1 | 8/2023 | Kozlowski et al. |
| 2023/0298885 A1 | 9/2023 | Borude et al. |
| 2023/0330747 A1 | 10/2023 | Barnes et al. |
| 2023/0330748 A1 | 10/2023 | Badwe et al. |
| 2023/0352196 A1 | 11/2023 | Ishikawa |
| 2023/0395889 A1 | 12/2023 | Yang et al. |
| 2024/0017322 A1 | 1/2024 | Badwe et al. |
| 2024/0057245 A1 | 2/2024 | Kozlowski et al. |
| 2024/0088467 A1 | 3/2024 | Liao et al. |
| 2024/0326128 A1 | 10/2024 | Hadidi et al. |
| 2024/0342791 A1 | 10/2024 | Badwe et al. |
| 2024/0367139 A1 | 11/2024 | Wrobel et al. |
| 2024/0383036 A1 | 11/2024 | Larouche et al. |
| 2025/0002362 A1 | 1/2025 | Pullen et al. |
| 2025/0014869 A1 | 1/2025 | Kozlowski et al. |
| 2025/0031295 A1 | 1/2025 | Shang et al. |

FOREIGN PATENT DOCUMENTS

| | | | | |
|---|---|---|---|---|
| CA | 2947531 | A1 | 11/2015 | |
| CN | 1188073 | A | 7/1998 | |
| CN | 1653869 | A | 8/2005 | |
| CN | 1675785 | A | 9/2005 | |
| CN | 1785500 | A | 6/2006 | |
| CN | 1967911 | A | 5/2007 | |
| CN | 101191204 | A | 6/2008 | |
| CN | 101391307 | A | 3/2009 | |
| CN | 101728509 | A | 6/2010 | |
| CN | 101804962 | A | 8/2010 | |
| CN | 101716686 | B | 2/2011 | |
| CN | 102328961 | A | 1/2012 | |
| CN | 102394290 | A | 3/2012 | |
| CN | 102412377 | A | 4/2012 | |
| CN | 102427130 | A | 4/2012 | |
| CN | 102021355 | B | 7/2012 | |
| CN | 102664273 | A | 9/2012 | |
| CN | 102723502 | A | 10/2012 | |
| CN | 102179521 | B | 1/2013 | |
| CN | 102867940 | A | 1/2013 | |
| CN | 102983312 | A | 3/2013 | |
| CN | 103121105 | A | 5/2013 | |
| CN | 103359713 | A | 10/2013 | |
| CN | 103402921 | A | 11/2013 | |
| CN | 102554242 | B | 12/2013 | |
| CN | 103456926 | A | 12/2013 | |
| CN | 103682372 | A | 3/2014 | |
| CN | 103682383 | A | 3/2014 | |
| CN | 103700815 | A | 4/2014 | |
| CN | 103874538 | A | 6/2014 | |
| CN | 103936096 | A | 7/2014 | |
| CN | 103956520 | A | 7/2014 | |
| CN | 104022284 | A | 9/2014 | |
| CN | 104064736 | A | 9/2014 | |
| CN | 104084592 | A | 10/2014 | |
| CN | 104209526 | A | 12/2014 | |
| CN | 104218213 | A | 12/2014 | |
| CN | 204156003 | U | 2/2015 | |
| CN | 104485452 | A | 4/2015 | |
| CN | 104752734 | A | 7/2015 | |
| CN | 103515590 | B | 9/2015 | |
| CN | 105514373 | A | 4/2016 | |
| CN | 105642879 | A | 6/2016 | |
| CN | 104772473 | B | 9/2016 | |
| CN | 106001597 | A | 10/2016 | |
| CN | 106044777 | A | 10/2016 | |
| CN | 106159316 | A | 11/2016 | |
| CN | 106216703 | A | 12/2016 | |
| CN | 106450146 | A | 2/2017 | |
| CN | 106493350 | A | 3/2017 | |
| CN | 206040854 | U | 3/2017 | |
| CN | 106684387 | A | 5/2017 | |
| CN | 106756417 | A | 5/2017 | |
| CN | 106784692 | A | 5/2017 | |
| CN | 106830019 | A | 6/2017 | |
| CN | 107093732 | A | 8/2017 | |
| CN | 107170973 | A | 9/2017 | |
| CN | 107541633 | A | 1/2018 | |
| CN | 107579241 | A | 1/2018 | |
| CN | 107931622 | A | 4/2018 | |
| CN | 108134104 | A | 6/2018 | |
| CN | 108145170 | A | 6/2018 | |
| CN | 108199107 | | * 6/2018 | ............ H01M 10/54 |
| CN | 108217612 | A | 6/2018 | |
| CN | 108336442 | | * 7/2018 | ............ H01M 10/54 |
| CN | 108620597 | A | 10/2018 | |
| CN | 108649190 | A | 10/2018 | |
| CN | 108666563 | A | 10/2018 | |
| CN | 108672709 | A | 10/2018 | |
| CN | 108878862 | A | 11/2018 | |
| CN | 108907210 | A | 11/2018 | |
| CN | 108933239 | A | 12/2018 | |
| CN | 108963239 | A | 12/2018 | |
| CN | 109167070 | A | 1/2019 | |
| CN | 109301212 | A | 2/2019 | |
| CN | 109616622 | A | 4/2019 | |
| CN | 109692965 | A | 4/2019 | |
| CN | 109742320 | A | 5/2019 | |
| CN | 109808049 | A | 5/2019 | |
| CN | 109888233 | A | 6/2019 | |
| CN | 110117020 | A | 8/2019 | |
| CN | 110153434 | A | 8/2019 | |
| CN | 110218897 | A | 9/2019 | |
| CN | 110299516 | A | 10/2019 | |
| CN | 110790263 | A | 2/2020 | |
| CN | 110993908 | A | 4/2020 | |
| CN | 111099577 | A | 5/2020 | |
| CN | 111342163 | | * 6/2020 | ............ B01D 53/68 |
| CN | 111342163 | A | 6/2020 | |
| CN | 111370751 | A | 7/2020 | |
| CN | 111403701 | A | 7/2020 | |
| CN | 111446426 | A | 7/2020 | |
| CN | 111515391 | A | 8/2020 | |
| CN | 111970807 | A | 11/2020 | |
| CN | 112259740 | A | 1/2021 | |

(56) References Cited

FOREIGN PATENT DOCUMENTS

| | | |
|---|---|---|
| CN | 112331947 A | 2/2021 |
| CN | 112397706 A | 2/2021 |
| CN | 112421006 A | 2/2021 |
| CN | 112421048 A | 2/2021 |
| CN | 112447977 A | 3/2021 |
| CN | 112768709 A | 5/2021 |
| CN | 112768710 A | 5/2021 |
| CN | 112768711 A | 5/2021 |
| CN | 112864453 A | 5/2021 |
| CN | 113097487 A | 7/2021 |
| CN | 113104838 A | 7/2021 |
| CN | 113764688 A | 12/2021 |
| CN | 113871581 A | 12/2021 |
| CN | 114388822 A | 4/2022 |
| CN | 114408899 A | 4/2022 |
| CN | 114744315 A | 7/2022 |
| CN | 114824297 A | 7/2022 |
| CN | 115394976 A | 11/2022 |
| DE | 10335355 A1 | 11/2004 |
| DE | 102006025124 A1 | 12/2006 |
| DE | 102009033251 A1 | 9/2010 |
| DE | 102010006440 A1 | 8/2011 |
| DE | 102011109137 A1 | 2/2013 |
| DE | 102013008025 A1 | 11/2014 |
| DE | 102018132896 A1 | 6/2020 |
| EP | 0 256 233 A2 | 2/1988 |
| EP | 0732761 A2 | 9/1996 |
| EP | 1769554 A2 | 4/2007 |
| EP | 1991388 A2 | 11/2008 |
| EP | 2 292 557 A1 | 3/2011 |
| EP | 2626936 A1 | 8/2013 |
| EP | 3 143 838 A1 | 3/2017 |
| EP | 3368238 A1 | 9/2018 |
| EP | 3474978 A1 | 5/2019 |
| EP | 4050974 A1 | 8/2022 |
| FR | 2525122 A1 | 10/1983 |
| FR | 2591412 A1 | 6/1987 |
| GB | 2595745 A | 12/2021 |
| GB | 2620597 A | 1/2024 |
| IN | 202011017775 | 10/2021 |
| JP | 56-155639 A | 12/1981 |
| JP | 58-069713 A | 4/1983 |
| JP | 63-243212 A | 10/1988 |
| JP | 10-172564 A | 6/1998 |
| JP | 10-296446 A | 11/1998 |
| JP | 11-064556 A | 3/1999 |
| JP | 2001-064703 A | 3/2001 |
| JP | 2001-504753 A | 4/2001 |
| JP | 2001-348296 A | 12/2001 |
| JP | 2002-121607 A | 4/2002 |
| JP | 2002-249836 A | 9/2002 |
| JP | 2002-332531 A | 11/2002 |
| JP | 2003-049201 A | 2/2003 |
| JP | 2003-109589 A | 4/2003 |
| JP | 2004-034014 A | 2/2004 |
| JP | 2004-505761 A | 2/2004 |
| JP | 2004-193115 A | 7/2004 |
| JP | 2004-232084 A | 8/2004 |
| JP | 2004-311297 A | 11/2004 |
| JP | 2004-340414 A | 12/2004 |
| JP | 2004-362895 A | 12/2004 |
| JP | 2005-015282 A | 1/2005 |
| JP | 2005-072015 A | 3/2005 |
| JP | 2005-076052 A | 3/2005 |
| JP | 2005-135755 A | 5/2005 |
| JP | 2005-187295 A | 7/2005 |
| JP | 2005-222956 A | 8/2005 |
| JP | 2005-272284 A | 10/2005 |
| JP | 2006-040722 A | 2/2006 |
| JP | 2007-113120 A | 5/2007 |
| JP | 2007-138287 A | 6/2007 |
| JP | 2007-149513 A | 6/2007 |
| JP | 2007-238402 A | 9/2007 |
| JP | 2008-230905 A | 10/2008 |
| JP | 2008-243447 A | 10/2008 |
| JP | 2009-021214 A | 1/2009 |
| JP | 2009-187754 A | 8/2009 |
| JP | 2010-024506 A | 2/2010 |
| JP | 2010-097914 A | 4/2010 |
| JP | 2010-135336 A | 6/2010 |
| JP | 2011-108406 A | 6/2011 |
| JP | 2011-222323 A | 11/2011 |
| JP | 2011-258348 A | 12/2011 |
| JP | 2012-046393 A | 3/2012 |
| JP | 2012-151052 A | 8/2012 |
| JP | 2012-234788 A | 11/2012 |
| JP | 2013-062242 A | 4/2013 |
| JP | 2013-063539 A | 4/2013 |
| JP | 2013-069602 A | 4/2013 |
| JP | 2013-076130 A | 4/2013 |
| JP | 2013-545228 A | 12/2013 |
| JP | 2014-070005 A | 4/2014 |
| JP | 2014-156365 A | 8/2014 |
| JP | 2015-048269 A | 3/2015 |
| JP | 2015-122218 A | 7/2015 |
| JP | 2016-029193 A | 3/2016 |
| JP | 2016-047961 A | 4/2016 |
| JP | 2016-162672 A | 9/2016 |
| JP | 2016-532773 A | 10/2016 |
| JP | 6103499 B2 | 3/2017 |
| JP | 2017-524628 A | 8/2017 |
| JP | 2018-141762 A | 9/2018 |
| JP | 2018-528328 A | 9/2018 |
| JP | 2018-190563 A | 11/2018 |
| JP | 2019-500503 A | 1/2019 |
| JP | 2019-055898 A | 4/2019 |
| JP | 2019-516020 A | 6/2019 |
| JP | 2019-112699 A | 7/2019 |
| JP | 2019-118882 A | 7/2019 |
| JP | 2019-520894 A | 7/2019 |
| JP | 2020-507193 A | 3/2020 |
| JP | 2020-121898 A | 8/2020 |
| JP | 2021-061089 A | 4/2021 |
| JP | 2021-061090 A | 4/2021 |
| JP | 2021-116191 A | 8/2021 |
| JP | 2022-530649 A | 6/2022 |
| KR | 10-0582507 B1 | 5/2006 |
| KR | 10-0681169 B1 | 2/2007 |
| KR | 10-2007-0076686 A | 7/2007 |
| KR | 10-0792152 B1 | 1/2008 |
| KR | 10-0793162 B1 | 1/2008 |
| KR | 10-0793163 B1 | 1/2008 |
| KR | 10-0839372 B1 | 6/2008 |
| KR | 10-2009-0070140 A | 7/2009 |
| KR | 10-1133094 B1 | 4/2012 |
| KR | 10-2013-0063718 A | 6/2013 |
| KR | 10-2014-0001813 U | 3/2014 |
| KR | 20-2014-0001813 U | 3/2014 |
| KR | 10-2014-0130943 A | 11/2014 |
| KR | 10-2015-0027042 A | 3/2015 |
| KR | 10-1504247 B1 | 3/2015 |
| KR | 10-1518234 B1 | 5/2015 |
| KR | 10-2015-0109914 A | 10/2015 |
| KR | 10-1574754 B1 | 12/2015 |
| KR | 10-2016-0063057 A | 6/2016 |
| KR | 10-1684219 B1 | 12/2016 |
| KR | 10-2017-0003550 A | 1/2017 |
| KR | 10-1708333 B1 | 2/2017 |
| KR | 10-2017-0039922 A | 4/2017 |
| KR | 10-2017-0045181 A | 4/2017 |
| KR | 10-1789191 B1 | 10/2017 |
| KR | 2018-0001799 A | 1/2018 |
| KR | 10-1829935 B1 | 2/2018 |
| KR | 10-2018-0035750 A | 4/2018 |
| KR | 10-2018-0080315 A | 7/2018 |
| KR | 10-1907912 B1 | 10/2018 |
| KR | 10-1907916 B1 | 10/2018 |
| KR | 10-1923466 B1 | 11/2018 |
| KR | 10-2044380 B1 | 11/2019 |
| KR | 10-2101006 B1 | 4/2020 |
| KR | 10-2111622 B1 | 5/2020 |
| KR | 10-2124946 B1 | 6/2020 |
| KR | 10-2020-0082581 A | 7/2020 |
| KR | 10-2020-0131751 A | 11/2020 |

(56) References Cited

FOREIGN PATENT DOCUMENTS

| | | |
|---|---|---|
| KR | 10-2021-0057253 A | 5/2021 |
| KR | 10-2021-0122035 A | 10/2021 |
| KR | 10-2359101 B1 | 2/2022 |
| KR | 10-2022-0042750 A | 4/2022 |
| KR | 10-2022-0044062 A | 4/2022 |
| KR | 10-2421156 B1 | 7/2022 |
| RU | 2252817 C1 | 5/2005 |
| RU | 2744449 C1 | 3/2021 |
| TW | 521539 B | 2/2003 |
| TW | 200630421 A | 9/2006 |
| TW | M303584 U | 12/2006 |
| TW | 200737342 A | 10/2007 |
| TW | 200823313 A | 6/2008 |
| TW | 200936775 A | 9/2009 |
| TW | I329143 B | 8/2010 |
| TW | 201112481 A | 4/2011 |
| TW | 201225389 A | 6/2012 |
| TW | 201310758 A | 3/2013 |
| TW | 201411922 A | 3/2014 |
| TW | I593484 B | 8/2017 |
| TW | 201908504 A | 3/2019 |
| TW | 202002723 A | 1/2020 |
| TW | 202033297 A | 9/2020 |
| WO | 03/77333 A1 | 9/2003 |
| WO | 2004/054017 A1 | 6/2004 |
| WO | 2004/089821 A1 | 10/2004 |
| WO | 2005/033007 A1 | 4/2005 |
| WO | WO 2005/039752 A1 | 5/2005 |
| WO | 2005/117176 A2 | 12/2005 |
| WO | 2006/100837 A1 | 9/2006 |
| WO | 2008/152638 A2 | 12/2008 |
| WO | 2010/095726 A1 | 8/2010 |
| WO | 2011/090779 A2 | 7/2011 |
| WO | WO 2011/082596 A1 | 7/2011 |
| WO | 2012/023858 A1 | 2/2012 |
| WO | 2012/054766 A2 | 4/2012 |
| WO | 2012/114108 A1 | 8/2012 |
| WO | WO 2012/144424 A1 | 10/2012 |
| WO | 2012/162743 A1 | 12/2012 |
| WO | 2013/017217 A1 | 2/2013 |
| WO | 2013/142287 A1 | 9/2013 |
| WO | 2014/011239 A2 | 1/2014 |
| WO | 2014/110604 A2 | 7/2014 |
| WO | WO 2014/153318 A8 | 9/2014 |
| WO | WO 2015/064633 A1 | 5/2015 |
| WO | 2015/141947 A1 | 9/2015 |
| WO | WO 2015/174949 A1 | 11/2015 |
| WO | 2015/187389 A2 | 12/2015 |
| WO | WO 2016/048862 A1 | 3/2016 |
| WO | 2016/082120 A1 | 6/2016 |
| WO | 2016/091957 A1 | 6/2016 |
| WO | 2017/070779 A1 | 5/2017 |
| WO | 2017/074081 A1 | 5/2017 |
| WO | 2017/074084 A1 | 5/2017 |
| WO | 2017/080978 A1 | 5/2017 |
| WO | WO 2017/091543 A1 | 6/2017 |
| WO | WO 2017/106601 A8 | 6/2017 |
| WO | 2017/118955 A1 | 7/2017 |
| WO | 2017/130946 A1 | 8/2017 |
| WO | 2017/158349 A1 | 9/2017 |
| WO | 2017/178841 A1 | 10/2017 |
| WO | WO 2017/177315 A1 | 10/2017 |
| WO | WO 2017/223482 A1 | 12/2017 |
| WO | 2018/133429 A1 | 7/2018 |
| WO | 2018/145750 A1 | 8/2018 |
| WO | WO 2018/141082 A1 | 8/2018 |
| WO | 2019/052670 A1 | 3/2019 |
| WO | WO 2019/045923 A1 | 3/2019 |
| WO | 2019/066081 A1 | 4/2019 |
| WO | WO 2019/095039 A1 | 5/2019 |
| WO | 2019/124344 A1 | 6/2019 |
| WO | WO 2019/139773 A1 | 7/2019 |
| WO | 2019/178668 A1 | 9/2019 |
| WO | WO 2019/243870 A1 | 12/2019 |
| WO | WO 2019/246242 A1 | 12/2019 |
| WO | WO 2019/246257 A1 | 12/2019 |
| WO | 2020/013667 A1 | 1/2020 |
| WO | WO 2020/009955 A1 | 1/2020 |
| WO | 2020/041767 A1 | 2/2020 |
| WO | 2020/041775 A1 | 2/2020 |
| WO | WO 2020/091854 A1 | 5/2020 |
| WO | WO 2020/132343 A1 | 6/2020 |
| WO | WO 2020/223358 A1 | 11/2020 |
| WO | WO 2020/223374 A1 | 11/2020 |
| WO | 2021/015119 A1 | 1/2021 |
| WO | 2021/029769 A1 | 2/2021 |
| WO | WO 2021/046249 A1 | 3/2021 |
| WO | 2021/085670 A1 | 5/2021 |
| WO | 2021/115596 A1 | 6/2021 |
| WO | WO 2021/118762 A1 | 6/2021 |
| WO | WO 2021/127132 A1 | 6/2021 |
| WO | 2021/142511 A1 | 7/2021 |
| WO | 2021/159117 A1 | 8/2021 |
| WO | 2021/191281 A1 | 9/2021 |
| WO | 2021/193857 A1 | 9/2021 |
| WO | 2021/245410 A1 | 12/2021 |
| WO | 2021/245411 A1 | 12/2021 |
| WO | WO 2021/263273 A1 | 12/2021 |
| WO | 2022/005999 A1 | 1/2022 |
| WO | WO 2022/032301 A1 | 2/2022 |
| WO | 2022/043701 A1 | 3/2022 |
| WO | 2022/043702 A1 | 3/2022 |
| WO | 2022/043704 A1 | 3/2022 |
| WO | 2022/043705 A1 | 3/2022 |
| WO | WO 2022/067303 A1 | 3/2022 |
| WO | 2022/075846 A1 | 4/2022 |
| WO | 2022/107907 A1 | 5/2022 |
| WO | 2022/133585 A1 | 6/2022 |
| WO | 2022/136699 A1 | 6/2022 |
| WO | 2022/150828 A1 | 7/2022 |
| WO | 2023/022492 A1 | 2/2023 |
| WO | 2023/038281 A1 | 3/2023 |
| WO | 2024/013488 A1 | 1/2024 |

OTHER PUBLICATIONS

Houmes et al., "Microwave Synthesis of Ternary Nitride Materials", Journal of Solid State Chemistry, vol. 130, Issue 2, May 1997, pp. 266-271.

Walter et al., "Microstructural and mechanical characterization of sol gel-derived Si—O—C glasses" Journal of the European Ceramic Society, vol. 22, Issue 13, Dec. 2002, pp. 2389-2400.

"Build Boldly", Technology Demonstration, 6K Additive, [publication date unknown], in 11 pages.

Ajayi, B. et al., "A rapid and scalable method for making mixed metal oxide alloys for enabling accelerated materials discovery", Journal of Materials Research, Jun. 2016, vol. 31, No. 11, pp. 1596-1607.

Bobzin, K. et al., "Modelling and Diagnostics of Multiple Cathodes Plasma Torch System for Plasma Spraying", Frontiers of Mechanical Engineering, Sep. 2011, vol. 6, pp. 324-331.

Bobzin, K. et al., "Numerical and Experimental Determination of Plasma Temperature during Air Plasma Spraying with a Multiple Cathodes Torch", Journal of Materials Processing Technology, Oct. 2011, vol. 211, pp. 1620-1628.

Boulos, M., "The inductively coupled radio frequency plasma", Journal of High Temperature Material Process, 1997, vol. 1, pp. 17-39.

Boulos, M., "Induction Plasma Processing of Materials for Powders, Coating, and Near-Net-Shape Parts", Advanced Materials & Processes, Aug. 2011, pp. 52-53, in 3 pages.

Boulos, M., "Plasma power can make better powders", Metal Powder Report, May 2004, vol. 59(5), pp. 16-21.

Carreon, H. et al., "Study of Aging Effects in a Ti—6Al—4V alloy with Widmanstatten and Equiaxed Microstructures by Non-destructive Means", AIP Conference Proceedings 1581, 2014 (published online Feb. 17, 2015), pp. 739-745.

Chang, S. et al., "One-Step Fast Synthesis of $Li_4Ti_5O_{12}$ Particles Using an Atmospheric Pressure Plasma Jet", Journal of the American Ceramic Society, Dec. 26, 2013, vol. 97, No. 3, pp. 708-712.

(56) References Cited

OTHER PUBLICATIONS

Chen, G. et al., "Spherical Ti—6Al—4V Powders Produced by Gas Atomization", Key Engineering Materials, vol. 704, Aug. 2016, pp. 287-292. URL: https://www.scientific.net/KEM.704.287.
Chikumba, S. et al., "High Entropy Alloys: Development and Applications", 7th International Conference on Latest Trends in Engineering & Technology (ICLTET'2015), Nov. 26-27, 2015, Irene, Pretoria (South Africa), pp. 13-17.
Coldwell, D. M. et al., "The reduction of $SiO_2$ with Carbon in a Plasma", Journal of Electrochemical Society, Jan. 1977, vol. 124, pp. 1686-1689.
Dearmitt, C., "26. Functional Fillers for Plastics", in *Applied Plastics Engineering Handbook—Processing and Materials*, ed., Myer Kutz, Elsevier, 2011, pp. 455-468.
Dolbec, R., "Recycling Spherical Powders", Presented at Titanium 2015, Orlando, FL, Oct. 2015, in 20 pages.
Fuchs, G.E. et al., "Microstructural evaluation of as-solidified and heat-treated y-TiAl based powders", Materials Science and Engineering, 1992, A152, pp. 277-282.
Gleiman, S. et al., "Melting and spheroidization of hexagonal boron nitride in a microwave-powered, atmospheric pressure nitrogen plasma", Journal of Materials Science, Aug. 2002, vol. 37(16), pp. 3429-3440.
Gradl, P. et al., "GRCop-42 Development and Hot-fire Testing Using Additive Manufacturing Powder Bed Fusion for Channel-Cooled Combustion Chambers", 55th AIAA/SAE/ASEE Joint Propulsion Conference 2019, Aug. 2019, pp. 1-26.
He, J. Y. et al., "A precipitation-hardened high-entropy alloy with outstanding tensile properties", Acta Materialia, 2016, vol. 102, pp. 187-196.
Ivasishin, O. M. et al., "Innovative Process for Manufacturing Hydrogenated Titanium Powder for Solid State Production of P/M Titanium Alloy Components", Titanium 2010, Oct. 3-6, 2010, in 27 pages.
Jia, H. et al., "Hierarchical porous silicon structures with extraordinary mechanical strength as high-performance lithium-ion battery anodes", Nature Communications, Mar. 2020, vol. 11, in 9 pages. URL: https://doi.org/10.1038/s41467-020-15217-9.
Ko, M. et al., "Challenges in Accommodating Volume Change of Si Anodes for Li-Ion Batteries", Chem Electro Chem, Aug. 2015, vol. 2, pp. 1645-1651. URL: https://doi.org/10.1002/celc.201500254.
Kotlyarov, V. I. et al., "Production of Spherical Powders on the Basis of Group IV Metals for Additive Manufacturing", Inorganic Materials: Applied Research, Pleiades Publishing, May 2017, vol. 8, No. 3, pp. 452-458.
Laine, R. M. et al., "Making nanosized oxide powders from precursors by flame spray pyrolysis", Key Engineering Materials, Jan. 1999, vol. 159-160, pp. 17-24.
Li, X. et al., "Mesoporous silicon sponge as an anti-pulverization structure for high-performance lithium-ion battery anodes", Nature Communications, Jul. 2014, vol. 5, Article No. 4105, in 7 pages. URL: https://doi.org/10.1038/ncomms5105.
Li, L. et al., "Spheroidization of silica powders by radio frequency inductively coupled plasma with Ar—H2 and Ar—N2 as the sheath gases at atmospheric pressure", International Journal of Minerals, Metallurgy, and Materials, Sep. 2017, vol. 24(9), pp. 1067-1074.
Li, Z. et al., "Strong and Ductile Non-Equiatomic High-Entropy Alloys: Design, Processing, Microstructure, and Mechanical Properties", The Journal of The Minerals, Metals & Materials Society, Aug. 2017, vol. 69(1), pp. 2099-2106. URL: https://doi.org/10.1007/s11837-017-2540-2.
Lin, M., "Gas Quenching with Air Products' Rapid Gas Quenching Gas Mixture", Air Products, Dec. 31, 2007, in 4 pages. URL: https://www.airproducts.co.uk/-/media/airproducts/files/en/330/330-07-085-us-gas-quenching-with-air-products-rapid-gas-quenching-gas-mixture.pdf.
Majewksi, T., "Investigation of W—Re—Ni heavy alloys produced from plasma spheroidized powders", Solid State Phenomena, Mar. 2013, vol. 199, pp. 448-453.
Moisan, M. et al., "Waveguide-Based Single and Multiple Nozzle Plasma Torches: the Tiago Concept", Plasma Sources Science and Technology, Jun. 2001, vol. 10, pp. 387-394.
Moldover, M. R. et al., "Measurement of the Universal Gas Constant R Using a Spherical Acoustic Resonator", Physical Review Letters, Jan. 1988, vol. 60(4), pp. 249-252.
Muoto, C. et al., "Phase Homogeneity in $Y_2O_3$—MgO Nanocomposites Synthesized by Thermal Decomposition of Nitrate Precursors with Ammonium Acetate Additions", Journal of the American Ceramic Society, 2011, vol. 94(12), pp. 4207-4217.
Murugan, K. et al., "Nanostructured α/β-tungsten by reduction of $WO_3$ under microwave plasma", International Journal of Refractory Metals and Hard Materials, Jan. 2011, vol. 29, pp. 128-133.
Nichols, F. A., "On the spheroidization of rod-shaped particles of finite length", Journal of Materials Science, Jun. 1976, vol. 11, pp. 1077-1082.
Nyutu, E. et al., "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, Feb. 1, 2008, vol. 112, No. 5, pp. 1407-1414.
Ohta, R. et al., "Effect of PS-PVD production throughput on Si nanoparticles for negative electrode of lithium ion batteries", Journal of Physics D: Applied Physics, Feb. 2018, vol. 51(1), in 7 pages.
Or, T. et al., "Recycling of mixed cathode lithium-ion batteries for electric vehicles: Current status and future outlook", Carbon Energy, Jan. 2020, vol. 2, pp. 6-43. URL: https://doi.org/10.1002/cey2.29.
Park, J. et al., "Preparation of spherical WTaMoNbV refractory high entropy alloy powder by inductively-coupled thermal plasma", Materials Letters, Aug. 2019, vol. 255, 126513, in 3 pages.
Popescu, G. et al., "New TiZrNbTaFe high entropy alloy used for medical applications", IOP Conference Series: Materials Science and Engineering, Mod Tech 2018, Sep. 2018, vol. 400, in 9 pages.
Reig, L. et al., "Microstructure and Mechanical Behavior of Porous Ti—6Al—4V Processed by Spherical Powder Sintering", Materials, Oct. 23, 2013, vol. 6, pp. 4868-4878.
Sastry, S.M.L. et al., "Rapid Solidification Processing of Titanium Alloys", Journal of Metals (JOM), Sep. 1983, vol. 35, pp. 21-28.
Savage, S. J. et al., "Production of rapidly solidified metals and alloys", Journal of Metals (JOM), Apr. 1984, vol. 36, pp. 20-33.
Sheng, Y. et al., "Preparation of Spherical Tungsten Powder by RF Induction Plasma", Rare Metal Materials and Engineering, Nov. 2011, vol. 40, No. 11, pp. 2033-2037.
Sheng, Y. et al., "Preparation of Micro-spherical Titanium Powder by RF Plasma", Rare Metal Materials and Engineering, Jun. 2013, vol. 42, No. 6, pp. 1291-1294.
Suryanarayana, C., "Recent Developments in Mechanical Alloying", Reviews on Advanced Materials Science, Aug. 2008, vol. 18(3), pp. 203-211.
Suryanarayana, C. et al., "Rapid solidification processing of titanium alloys", International Materials Reviews, 1991, vol. 36, pp. 85-123.
Tang, H. P. et al., "Effect of Powder Reuse Times on Additive Manufacturing of Ti—6Al—4V by Selective Electron Beam Melting", JOM, Mar. 2015, vol. 67, pp. 555-563.
Van Laar, J. H. et al., "Spheroidisation of Iron Powder in a Microwave Plasma Reactor", Journal of the Southern African Institute of Mining and Metallurgy, Oct. 2016, vol. 116, No. 10, pp. 941-946.
Veith, M. et al., "Low temperature synthesis of nanocrystalline $Y_3Al_5O_{12}$ (YAG) and Cedoped $Y_3Al_5O_{12}$ via different sol-gel methods", The Journal of Materials Chemistry, Jan. 1999, vol. 9, pp. 3069-3079.
Wang, J. et al., "Preparation of Spherical Tungsten and Titanium Powders by RF Induction Plasma Processing", Rare Metals, Jun. 2015 (published online May 31, 2014), vol. 34, No. 6, pp. 431-435.
Wang, Y. et al., "Developments in Nanostructured Cathode Materials for High-Performance Lithium-Ion Batteries", Advanced Materials, Jun. 2008, pp. 2251-2269.
Yang, S. et al., "Preparation of Spherical Titanium Powders from Polygonal Titanium Hydride Powders by Radio Frequency Plasma Treatment", Materials Transactions, Nov. 2013, vol. 54, No. 12, pp. 2313-2316.

(56) References Cited

OTHER PUBLICATIONS

Zhang, Y. S. et al., "Core-shell structured titanium-nitrogen alloys with high strength, high thermal stability and good plasticity", Scientific Reports, Jan. 2017, vol. 7, in 8 pages.

Zhang, K., Ph.D., "The Microstructure and Properties of Hipped Powder Ti Alloys", a thesis submitted to The University of Birmingham, College of Engineering and Physical Sciences, Apr. 2009, in 65 pages.

Zhang, X. et al., "High thickness tungsten coating with low oxygen content prepared by air plasma spray", Cailliao Gongcheng, 2014, vol. 5, pp. 23-28.

Zhang, Y. et al., "Microstructures and properties of high-entropy alloys", Progress in Materials Science, Apr. 2014 (available online Nov. 2013), vol. 61, pp. 1-93.

Zhang, Y. D. et al., "High-energy cathode materials for Li-ion batteries: A review of recent developments", Science China Technological Sciences, Sep. 2015, vol. 58(11), pp. 1809-1828.

Zielinski, A. et al., "Modeling and Analysis of a Dual-Channel Plasma Torch in Pulsed Mode Operation for Industrial, Space, and Launch Applications", IEEE Transactions on Plasma Science, Jul. 2015, vol. 43(7), pp. 2201-2206.

International Search Report and Written Opinion, re PCT Application No. PCT/US2022/70066, mailed Mar. 17, 2022.

6K, "6K Launches World's First Premium Metal Powders For Additive Manufacturing Derived From Sustainable Sources", Cision PR Newswire, Nov. 4, 2019, in 1 page. URL: https://www.prnewswire.com/news-releases/6k-launches-worlds-first-premium-metal-powders-for-additive-manufacturing-derived-from-sustainable-sources-300950791.html.

Bell, T. "The properties and uses of silicon metal", ThoughtCo., Aug. 15, 2019, in 13 pages. URL: https://www.thoughtco.com/metal-profile-silicon-4019412.

Chau, J. L. K. et al. "Microwave Plasma Production of Metal Nanopowders," Jun. 12, 2014, Inorganics, vol. 2, pp. 278-290 (Year: 2014).

Chen, Z., et al., "Advanced cathode materials for lithium-ion batteries", MRS Bulletin, vol. 36, No. 7, 2011, pp. 498-505.

Colombini, E., et al., "High entropy alloys obtained by field assisted powder metallurgy route: SPS and microwave heating", Materials Chemistry and Physics, vol. 210, May 1, 2018, pp. 78-86.

Czosnek, C., et al., "Preparation of silicon carbide SIC-based nanopowders by the aerosol-assisted synthesis and the DC thermal plasma synthesis methods", Materials Research Bulletin, vol. 63, Mar. 2015, pp. 164-172.

Fang, S., et al., "Microstructure and mechanical properties of twinned Al0.5CrFeNiCo0.300.2 high entropy alloy processed by mechanical alloying and spark plasma sintering", Materials & Design, vol. 54, 2014, pp. 973-979.

Huang, Q., et al., "The reactivity of charged positive Li1-n[NixMnyCoz]O2 electrodes with electrolyte at elevated temperatures using accelerating rate calorimetry", Journal of Power Sources, vol. 390, Apr. 2018, pp. 78-86.

International Preliminary Report on Patentability and Written Opinion, re PCT Application No. PCT/US2022/070066, mailed Jul. 20, 2023.

Kim, H., et al., "Three-Dimensional Porous Silicon Particles for Use in High-Performance Lithium Secondary Batteries", Angewandte Chernie International Edition, vol. 47, No. 2, Dec. 15, 2008, pp. 10151-10154.

Kim, S. et al., "Thermodynamic Evaluation of Oxygen Behavior in TI Powder Deoxidized by Ca Reductant", Met. Mater. Int., 2016, vol. 22, pp. 658-662.

Krivolapova, O. N., et al., "Application of microwave radiation for decrepitation of spodumene from the Kolmozerskoe deposit", Izvestiya. Non-ferrous Metallurgy, vol. 29, No. 6, 2023, 16 pages.

Lin et al., "A low temperature molten salt process for aluminothermic reduction of silicon oxides to crystalline Si for Li-ion batteries", Energy Environ. Sci., 2015, 8, 3187 (Year: 2015).

Lin, H., et al., "Synthesis of amorphous silicon carbide nanoparticles in a low temperature low pressure plasma reactor", Nanotechnology, vol. 19, No. 32, Jul. 2008,in 8 pages.

Liu, Z., et al., "Synthesis and characterization of LiNi1-x-yCoxMnyO2 as the cathode materials of secondary lithium batteries", Journal of Power Sources, vol. 81-82, Sep. 1999, pp. 416-419.

Miller et al., "The reduction of silica with carbon and silicon carbide", Journal of the American Ceramic Society, 1978, 62 (Year: 1978).

Nava-Avendano, J., et al., "Plasma processes in the preparation of lithium-ion battery electrodes and separators" Journal of Physics D: Applied Physics, vol. 50, No. 16, 2017, 23 pages.

Razaee, M., et al., "Microwave-assisted calcination of spodumene for efficient, low-cost and environmentally friendly extraction of lithium", Powder Technology, vol. 397, Jan. 2022, 8 pages.

Sabat, K.C., "Hydrogen Plasma—Thermodynamics", Journal of Physics: Conference Series, 2019, International Conference on Applied Physics, Powder and Material Science, in 6 pages.

Schmidt-Ott, K., "Plasma-Reduction: Its Potential for Use in the Conservation of Metals", Proceedings of Metal 2004, Oct. 2004, pp. 235-246.

SK makes world's 1st NCM battery with 90% nickel, The Investor, available online <https://www.theinvestor.co.kr/view.php?ud=20200810000820>, dated Aug. 10, 2020, 2 pages.

Sun, S., et al., "Rapid degradation and efficient defluorination of perfluorooctanoic acid(PFOA) by microwave discharge plasma in liquid combined with catalytic ions Fe2+", Journal of Environmental Chemical Engineering, vol. 11, Apr. 2023, in 9 pages.

Sun, S., et al., "Efficient defluorination of PFOA by microwave discharge plasma in liquid: Influence of actual water environment factors", Journal of Water Process Engineering, vol. 55, Aug. 2023, in 8 pages.

Taylor, G., et al.; "Reduction of Metal Oxides by Hydrogen", 1930, vol. 52 (Year: 1930).

Thierry, "Hydrogen (H2) Plasma", Thierry Corp., retrieved from internet on Feb. 15, 2024, in 2 pages. URL: https://www.thierry-corp.com/plasma-knowledgebase/hydrogen-h2-plasma.

Wang, Y., et al., "High-Voltage "Single-Crystal" Cathode Materials for Lithium-Ion Batteries", Energy & Fuels, vol. 35, No. 3, Jan. 14, 2021, 15 pages.

Yang, P., et al., "Electromagnetic wave absorption properties of mechanically alloyed FeCoNiCrAl high entropy alloy powders", Advanced Powder Technology, vol. 27, No. 4, 2016, pp. 1128-1133.

Zhao Jing et al., "Introduction to Materials Science," China Light Industry Press, 2nd edition, 1st printing, Jun. 2013, p. 61.

Zhu, H. et al., "Study on behaviors of tungsten powders in radio frequency thermal plasma", International Journal of Refractory Metals and Hard Materials, vol. 66, Aug. 2017, pp. 76-82.

"High-entropy alloy", Wikipedia, webpage last edited Dec. 29, 2022 (accessed Jan. 17, 2023), in 16 pages. URL: https://en.wikipedia.org/wiki/High-entropy_alloy.

Ali, My., et al., Spray Flame Synthesis (SFS) of Lihium Lanrthaum Zirconate (LLZO) Solid Electroly, Materials, vol. 14, No. 13, 2021, pp. 1-13.

Barbis et al., "Titanium powders from the hydride-dehydride process." Titanium Powder Metallurgy. Butterworth-Heinemann, 2015. pp. 101-116.

Bardos, L., et al., "Differences between microwave and RF activation of nitrogen for the PECVD process", J. Phys. D: Appl. Phys., vol. 15, 1982, pp. 79-82.

Bardos, L., et al., "Microwave Plasma Sources and Methods in Processing Technology", IEEE Press, 2022, 10 pages.

Choi, S. I., et al., "Continuous process of carbon nanotubes synthesis by decomposition of methane using an arc-jet plasma", Thin Solid Films, 2006, vol. 506-507, 2006, pp. 244-249.

Collin, J. E., et al., "Ionization of methane and it's electronic energy levels", Canadian Journal of Chemistry, 2011, vol. 45, No. 16, pp. 1875-1882.

Decker, J., et al., "Sample preparation protocols for realization of reproducible characterization of single-wall carbon nanotubes", Metrologia, 2009, vol. 46, No. 6, pp. 682-692.

(56) References Cited

OTHER PUBLICATIONS

Ding, F., et al., "Nucleation and Growth of Single-Walled Carbon Nanotubes: A Molecular Dynamics Study", J. Phys. Chem. B, vol. 108, 2004, pp. 17369-17377.

Ding, F., et al., "The Importance of Strong Carbon-Metal Adhesion for Catalytic Nucleation of Single-Walled Carbon Nanotubes", Nano Letters, 2008, vol. 8, No. 2, pp. 463-468.

Dors, M., et al., "Chemical Kinetics of Methane Pyrolysis in Microwave Plasma at Atmospheric Pressure", Plasma Chem Plasma Process, 2013, vol. 34, No. 2, pp. 313-326.

Eremin, A., et al., "The Role of Methyl Radical in Soot Formation", Combustion Science and Technology, vol. 191, No. 12, 2008, pp. 2226-2242.

Finckle, J. R., et al., "Plasma Pyrolysis of Methane to Hydrogen and Carbon Black", Industrial Engineering and Chemical Research, 2002. vol. 41, No. 6, 2002, pp. 1425-1435.

Fu, D., et al., "Direct synthesis of Y-junction carbon nanotubes by microwave-assisted pyrolysis of methane", Materials Chemistry and Physics, vol. 118, vol. 2-3, 2009, pp. 501-505.

Grace, J. et al., "Connecting particle sphericity and circularity", Particuology, vol. 54, 2021, pp. 1-4, ISSN 1674-2001, https://doi.org/10.1016/j.partic.2020.09.006. (Year: 2020).

Haghighatpanah, S., et al., "Computational studies of catalyst-free single walled carbon nanotube growth", J Chem Phys, vol. 139, No. 5, 10 pages.

Haneklaus, N., et al., "Stop Smoking—Tube-In-Tube Helical System for Flameless Calcination of Minerals," Processes, vol. 5, No. 4, Nov. 3, 2017, pp. 1-12.

Huo, H., et al., "Composite electrolytes of polyethylene oxides/garnets interfacially wetted by ionic liquid for room-temperature solid-state lithium battery", Journal of Power Sources, vol. 372, 2017, pp. 1-7.

Irle, S., et al., "Milestones in molecular dynamics simulations of single-walled carbon nanotube formation: A brief critical review", Nano Research, 2009, vol. 2, No. 10, pp. 755-767.

Jasek, O., et al., "Microwave plasma-based high temperature dehydrogenation of hydrocarbons and alcohols as a single route to highly efficient gas phase synthesis of freestanding graphene", Nanotechnology, 2021, vol. 32, 11 pages.

Jasinski, M., et al., "Atmospheric pressure microwave plasma source for hydrogen production", International Journal of Hydrogen Energy, vol. 38, Issue 26, 2013, pp. 11473-11483.

Jasinski, M., et al., "Hydrogen production via methane reforming using various microwave plasma sources", Chem. Listy, 2008, vol. 102, pp. s1332-s1337.

Kassel, L. S., "The Thermal Decomposition of Methane", Journal of the American Chemical Society, vol. 54, No. 10, 1932, pp. 3949-3961.

Kerscher, F., et al., "Low-carbon hydrogen production via electron beam plasma methane pyrolysis: Techno-economic analysis and carbon footprint assessment", International Journal of Hydrogen Energy, vol. 46, Issue 38, 2021, pp. 19897-19912.

Kim, K. S., et al., "Synthesis of single-walled carbon nanotubes by induction thermal plasma", Nano Research, 2009, vol. 2, No. 10, pp. 800-817.

Kumal, R. R., et al., "Microwave Plasma Formation of Nanographene and Graphitic Carbon Black", C, 2020, vol. 6, No. 4, 10 pages.

Lee, D. H., et al., "Comparative Study of Methane Activation Process by Different Plasma Sources", Plasma Chem. Plasma Process., vol. 33, No. 4, 2013, pp. 647-661.

Lee, D. H., et al., "Mapping Plasma Chemistry in Hydrocarbon Fuel Processing Processes", Plasma Chem. Plasma Process., vol. 33, No. 1, 2013, pp. 249-269.

Liu, Y., et al., "Advances of microwave plasma-enhanced chemical vapor deposition in fabrication of carbon nanotubes: a review", J Mater Sci., vol. 55, 2021, pp. 12559-12583.

Olsvik, O., et al., "Thermal Coupling of Methane—A Comparison Between Kinetic Model Data and Experimental Data", Thermochimica Acta., vol. 232, No. 1, 1994, pp. 155-169.

Pulsation Reactors—Thermal Processing for Extraordinary Material Properties, retrieved from https://www.ibu-tec.com/facilities/pulsation-reactors/, retrieved on Mar. 18, 2023, pp. 5.

Seehra, M. S., et al., "Correlation between X-ray diffraction and Raman spectra of 16 commercial graphene-based materials and their resulting classification", Carbon N Y., 2017, vol. 111, pp. 380-384.

Wang, H., et al., "A detailed kinetic modeling study of aromatics formation in laminar premixed acetylene and ethylene flames" Combustion and Flame, vol. 110, No. 1-2, 1997, pp. 173-221.

Zavilopulo, A. N., et al., "Ionization and Dissociative Ionization of Methane Molecules", Technical Physics, vol. 58, No. 9, 2013, pp. 1251-1257.

Zeng, X., et al., "Growth and morphology of carbon nanostructures by microwave-assisted pyrolysis of methane", Physica E., vol. 42, No. 8, 2010, pp. 2103-2108.

Zhang, H., et al., "Plasma activation of methane for hydrogen production in a N2 rotating gliding arc warm plasma: A chemical kinetics study", Chemical Engineering Journal, vol. 345, 2018, pp. 67-78.

Zhang, J., et al., "Flexible and ion-conducting membrane electrolytes for solid-state lithium batteries: Dispersion of garnet nanoparticles in insulating polyethylene oxide", Nano Energy, vol. 28, 2016, pp. 447-454.

Zhong, R., et al., "Continuous preparation and formation mechanism of few-layer graphene by gliding arc plasma", Chemical Engineering Journal, vol. 387, 2020, 10 pages.

\* cited by examiner

METHODS AND SYSTEMS FOR RECLAMATION OF LI-ION CATHODE MATERIALS USING MICROWAVE PLASMA PROCESSING

INCORPORATION BY REFERENCE TO ANY PRIORITY APPLICATIONS

This application claims the priority benefit under 35 U.S.C. § 119(e) of U.S. Provisional Application No. 63/135, 948, filed Jan. 11, 2021, the entire disclosure of which is incorporated herein by reference. Any and all applications for which a foreign or domestic priority claim is identified in the Application Data Sheet as filed with the present application are hereby incorporated by reference under 37 CFR 1.57.

BACKGROUND

Field

Some embodiments of the present disclosure are directed to systems and methods for reclaiming used cathode materials using microwave plasma processing.

Description

Lithium-ion batteries (LIBs) have dominated the secondary energy storage market due to their unmatched combination of energy density (150-200 W h/kg, normalized by device mass), power output (>300 W/kg), and cycle stability (~2000 cycles) coupled with lower costs due to the increasing global production capacity. Worldwide trends in mobile electrification, largely driven by the popularity of electric vehicles (EVs) has significantly increased demand for LIB production. As such, millions of metric tons of LIB waste from EV battery packs will be generated over the next several decades alone. Moreover, LIB technology is expected to play an important role in stationary energy storage systems that require high power output, enabling energy harvesting from intermittent natural sources. LIB recycling directly addresses concerns over long-term economic strains and environmental issues associated with both landfilling and raw material extraction. However, LIB recycling infrastructure has not been widely adopted, and current facilities are mostly focused on Co recovery for economic gains, rather than reuse of cathode materials.

Recycling processes to recover or reuse metals in mixed-metal LIB cathodes and comingled scrap comprising different chemistries are needed. These processes require a low environmental footprint and energy consumption. In some existing processes, a pretreatment may be used to separate the cathode materials from other battery components, followed by entirely dissolving the active material using reductive acid leaching. A complex leachate is generated, comprising cathode metals (Li+, Ni2+, Mn2+, and Co2+) and impurities (Fe3+, Al3+, and Cu2+) from the current collectors and battery casing, which can be separated and purified using a series of selective precipitation and/or solvent extraction steps. Alternatively, the cathode can be resynthesized directly from the leachate. In other existing methods, the battery materials undergo a high-temperature melting-and-extraction, or smelting, process. Those operations are energy intensive, expensive, and operate and require sophisticated equipment to treat harmful emissions generated by the smelting process. Despite the high costs, these processes cannot recover all valuable battery materials.

It is evident that recycling infrastructure cannot primarily focus on recovering Co to maximize profits, especially given the market trends for LIB cathode chemistries driven by the EV market. Even now, cathode materials such as $LiNi_{1/3}Mn_{1/3}Co_{1/3}O_2$ (NMC-111) are being substituted with $LiNi_{0.6}Mn_{0.2}Co_{0.2}O_2$ (NMC-622) and $LiNi_{0.8}Mn_{0.1}Co_{0.1}O_2$ (NMC-811), which comprise even smaller quantities of Co. Thus, recycling processes must handle diverse mixed-type cathodes and comingled scraps containing various cathode chemistries with high efficiency. In addition, in view for the growing demand for LIB cathode materials, recycling processes should be capable of producing usable cathode materials for LIBs through lithium supplementation, rather than simply recovering the metals, such as Co, separately.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

Some embodiments herein are directed to methods for synthesizing lithium nickel manganese cobalt oxide (NMC) powder in a microwave plasma apparatus, the method comprising: providing a feedstock to the microwave plasma apparatus, the feedstock comprising end-of-life NMC powder, the end-of-life NMC powder having an average nickel to cobalt ratio of 5:2 or less; and introducing the feedstock into a microwave-generated plasma of the microwave plasma apparatus to synthesize an NMC powder having an average nickel to cobalt ratio greater than 5:2.

In some embodiments, the method further comprises introducing nickel containing material, manganese containing material, or cobalt containing material into the microwave-generated plasma concurrently with introducing the feedstock into the microwave-generated plasma. In some embodiments, a microstructure of the end-of-life NMC powder comprises one or more imperfections, cracks, or fissures, and wherein introducing the feedstock into the microwave-generated plasma melts the end-of-life NMC powder. In some embodiments, a microstructure of the synthesized NMC powder does not comprise the one or more imperfections, cracks, or fissures.

In some embodiments, the method further comprises introducing lithium (Li) containing material into the microwave-generated plasma concurrently introducing the feedstock into the microwave-generated plasma. In some embodiments, the end-of-life NMC powder comprises NMC-532 or NMC-111. In some embodiments, the method further comprises adding lithium (Li) containing material to the feedstock prior to introducing the feedstock into the microwave-generated plasma. In some embodiments, the end-of-life NMC powder is obtained from a used lithium-ion battery.

Some embodiments herein are directed to methods for synthesizing lithium nickel manganese cobalt oxide (NMC) powder in a microwave plasma apparatus, the method comprising: providing a feedstock to the microwave plasma apparatus, the feedstock comprising end-of-life NMC powder, the end-of-life NMC powder and having an average nickel to cobalt ratio of 5:2 or less; and introducing the end-of-life NMC powder into a microwave-generated plasma of the microwave plasma apparatus to synthesize an NMC powder having an average nickel to cobalt ratio greater than 5:2, wherein the end-of-life NMC powder is not reduced to its constituent elements prior to introducing the end-of-life NMC powder into the microwave-generated plasma.

In some embodiments, the method further comprises introducing nickel containing material into the microwave-generated plasma concurrently with introducing the feedstock into the microwave-generated plasma. In some embodiments, a microstructure of the end-of-life NMC powder comprises one or more imperfections, cracks, or fissures, and wherein introducing the feedstock into the microwave-generated plasma melts the end-of-life NMC powder. In some embodiments, a microstructure of the synthesized NMC powder does not comprise the one or more imperfections, cracks, or fissures.

In some embodiments, the method further comprises introducing lithium (Li) containing material into the microwave-generated plasma concurrently introducing the feedstock into the microwave-generated plasma. In some embodiments, the end-of-life NMC powder comprises NMC-532 or NMC-111. In some embodiments, the method further comprises adding lithium (Li) containing material to the feedstock prior to introducing the feedstock into the microwave-generated plasma. In some embodiments, the end-of-life NMC powder is obtained from a used lithium-ion battery.

Some embodiments herein are directed to lithium nickel manganese cobalt oxide (NMC) powders produced by a method comprising: providing a feedstock to a microwave plasma apparatus, the feedstock comprising end-of-life NMC powder, the end-of-life NMC powder having an average nickel to cobalt ratio of 5:2 or less; and introducing the feedstock into a microwave-generated plasma of the microwave plasma apparatus to synthesize an NMC powder or an NMC precursor having an average nickel to cobalt ratio greater than 5:2.

In some embodiments, the end-of-life NMC powder comprises NMC-111, NMC-442, or NMC-532. In some embodiments, the NMC powder or the NMC precursor comprises NMC-611, NMC-811, or NMC-9.5.5. In some embodiments, the NMC powder or the NMC precursor has an average nickel to cobalt ratio of 5:2, 6:1, 8:1, or 18:1.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein.

DETAILED DESCRIPTION

Figure 1:
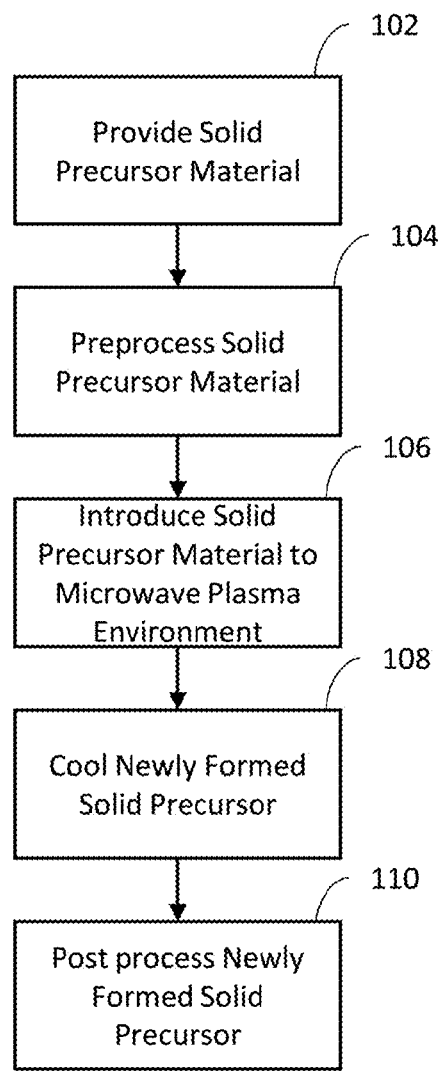
FIG. 1 illustrates a flowchart of an example process for recycling a used solid feedstock using a microwave plasma process according to embodiments of the present disclosure.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

Disclosed herein are embodiments of systems and methods for recycling used solid feedstocks containing lithium powders for use in LIBs and battery cells. The powders may be Lithium Nickel Manganese Cobalt Oxide (NMC) materials. In some embodiments, the used solid feedstock can undergo a microwave plasma process to produce a newly usable, lithium supplemented solid precursor.

Specifically, disclosed herein are methodologies, systems, and apparatus for producing recycled lithium-containing particles and Li-ion battery materials from used solid feedstocks. Cathode materials for Li-ion batteries can include lithium-containing transition metal oxides, such as, for example, $LiNi_xMn_yCo_zO_2$ or $LiNi_xCo_yAl_zO_2$, where x+y+z equals 1 (or about 1). These materials may contain a layered crystal structure where layers of lithium atoms sit between layers of transition-metal oxide polyhedra. However, alternative crystal structures can be formed as well, such as spinel type crystal structures. As deintercalation of Li-ions occurs from the crystal structure, charge neutrality is maintained with an increase in the valence state of the transition metals. $LiNi_xMn_yCo_zO_2$ or $LiNi_xCo_yAl_zO_2$ possess desirable characteristics such as relatively high energy density (mA h/g), high cyclability (% degradation per charge/discharge cycle), and thermal stability ($\leq 100°$ C.).

In some embodiments, the used solid feedstock may comprise end-of-life NMC or other used cathode materials from used LIBs or other sources. In some embodiments, the used solid feedstock may comprise a cathode composition, including but not limited to, $LiCoO_2$ (LCO), $LiFePO_4$ (LFP), $LiMn_2O_4$ (LMO), $LiNi_{1/3}Mn_{1/3}Co_{1/3}O_2$ (NMC-111), $LiNi_{0.5}Mn_{0.3}Co_{0.2}O_2$ (NMC-532), $LiNi_{0.6}Mn_{0.2}Co_{0.2}O_2$ (NMC-622) or $LiNi_{0.8}Mn_{0.1}Co_{0.1}O_2$ (NMC-811), or $LiNi_{0.8}Co_{0.15}Al_{0.05}O_2$ (NCA). Most preferably, the used solid feedstock comprises a form of NMC. In some embodiments, the NMC comprises NMC-532 or an NMC having an average nickel to cobalt ratio of 5:2 or less. The starting used solid cathode precursor materials are not limiting.

Various characteristics of the final newly formed solid precursor lithium-containing particles, such as porosity, particle size, particle size distribution, phase composition and purity, microstructure, etc. can be tailored and controlled by fine tuning various process parameters and input materials. In some embodiments, these can include precursor solution chemistry, plasma gas flow rates, plasma process gas choice, residence time of the used precursor within the plasma, quenching rate, power density of the plasma, etc. These process parameters can be tailored, in some embodiments, to produce micron and/or sub-micron scale particles with tailored surface area, a specific porosity level, low-resistance Li-ion diffusion pathway, a span of less than about 2 (span+d90–d10/d50) and containing a micro- or nano-grain microstructure. For example, desirable NMC material properties may include a layered α-$NaFeO_2$-type crystal structure with a particle size distribution (PSD) d50 of about 8-13 µm with a primary grain size of about 0.5-1 µm, a surface area of less than about 0.3 $m^3/g$ and a tap density of greater than about 2.4 $g/cm^3$. In some embodiments, when using powder feedstock, the size distribution may depend on the PSD of the input material.

FIG. 1 illustrates a flowchart of an example process for recycling a used solid feedstock using a microwave plasma process according to embodiments of the present disclosure.

In some embodiments, the used solid feedstock may undergo preprocessing steps prior to introducing the used solid feedstock to a microwave plasma apparatus. In some embodiments, this preprocessing may comprise lithium replacement and/or additional changes to the chemistry of the used solid feedstock. For example, the composition of the used solid feedstock may be changed by adding component powders, such as nickel containing, manganese containing, or cobalt containing powder, to the used solid feedstock prior to microwave processing. As such, the nickel content of the used solid feedstock may be augmented in the methods described herein. In some embodiments, preprocessing may also include additional washing to remove residual electrolytes, carbon and/or contamination. Preprocessing may also include milling to break feedstock particles into the primary grains, then forming a slurry and spray drying the granules to form a solid dry powder to be fed into the plasma. Other preprocesses may include heat treatment to re-introduce dissociated lithium back into the layered crystal structure. Also, preprocessing may include particle size classification.

In some embodiments, the used solid feedstock, which may preferably be preprocessed, is introduced to a microwave plasma environment of a microwave plasma apparatus. In some embodiments, the microwave plasma environment may comprise the exhaust or torch of the microwave plasma apparatus. In some embodiments, the microstructure of the used solid feedstock may comprise one or more imperfections, cracks, or fissures due to usage/power cycling of the used solid feedstock within a LIB. In some embodiments, introducing the used solid feedstock into the microwave plasma environment may melt the used solid feedstock. In some embodiments, melting may result in some lithium loss in the process. However, lithium may be supplemented in the final product to make up for this lithium loss.

In some embodiments, during microwave plasma processing and subsequent cooling, the used solid feedstock may be reformed into electroactive material with a desired chemistry and desired crystallographic structure. Furthermore, the newly formed solid precursor may comprise a microstructure in which some or all of the one or more imperfections, cracks, or fissures are eliminated. Without being limited by theory, in some embodiments, when the used solid feedstock is melted within the microwave plasma environment and subsequently reformed with the desired chemistry, the microstructure is altered, and any cracks may be sealed or otherwise eliminated.

The used precursor material, either liquid or solid, can be introduced into a plasma for processing. U.S. Pat. Pub. No. 2018/0297122, U.S. Pat. Nos. 8,748,785 B2, and 9,932,673 B2 disclose certain processing techniques that can be used in the disclosed process, specifically for microwave plasma processing. Accordingly, U.S. Pat. Pub. No. 2018/0297122, U.S. Pat. Nos. 8,748,785 B2, and 9,932,673 B2 are incorporated by reference in its entirety and the techniques describes should be considered to be applicable to the used precursor feedstocks described herein. The plasma can include, for example, an axisymmetric microwave generated plasma and a substantially uniform temperature profile.

In some embodiments, rather than preprocessing the used solid feedstock by replacing lost lithium, lithium may be introduced into the microwave plasma simultaneously with the used solid feedstock. In some embodiments, introducing lithium concurrently with the used solid feedstock may replace any lost lithium in the used solid feedstock upon formation of the newly formed solid precursor.

One advantage of the systems and methods herein is that breaking down of the used solid feedstock into its individual constituent elements is avoided. Rather, in some embodiments, the used solid feedstock comprises directly recycled cathode material without reducing the material to its constituent elements. In the case of NMC, the used NMC may not be reduced to elemental nickel, cobalt, and manganese. Instead, in some embodiments, the NMC may comprise a used solid feedstock to be directly introduced into a microwave plasma apparatus to form newly formed solid NMC precursor.

In some embodiments, the newly formed solid precursor (e.g., NMC) may have a different chemistry than the used solid feedstock. For example, the newly formed solid precursor may have a higher nickel content than the used solid feedstock. Specifically, in some embodiments, the used feedstock may comprise NMC-532, NMC-111, or a mixture of NMC powders having a nickel to cobalt ratio of 5:2 or less, and the newly formed solid precursor may comprise NMC-622, NMC-811, NMC-9.5.5 or another NMC powder having a nickel to cobalt ratio greater than 5:2. This is an advantage over existing processes, as the ability to change the chemistry of NMC powder is limited in an ordinary heating process, in which particles would undesirably sinter together in a crucible or furnace. As such, in previous processes, NMC would need to be reduced to its constituent elements and then resynthesized with the desired chemistry. Using microwave plasma processing however, the chemistry of the NMC may be changed with direct recycling (i.e., without reduction to constituent elements) because of the extremely high temperature and particle interactions within the microwave plasma environment. As with the lithium replacement, the chemistry of the used solid feedstock may be altered by introducing elemental metal powders (e.g., nickel powder), metallic salts, and/or metal oxides (e.g., NiO) concurrently into the microwave plasma apparatus concurrently with the used solid feedstock.

In some embodiments, following the plasma processing, the final newly formed solid precursor, such as layered NMC crystal structures or NMC particles, are formed. Therefore, no post-processing is needed, such as calcining, which can save significant time in the production of the NMCs, such a layered NMC crystal structure.

In some embodiments, the methods described herein can be used to produce newly formed solid precursor lithium-containing materials, such as $LiNi_xMn_yCo_zO_2$ (where $x≥0$, $y≥0$, $z≥0$, and $x+y+z=1$). For example, $LiNi_{0.5}Mn_{0.3}Co_{0.2}O_2$ (NMC-532), $LiNi_{0.6}Mn_{0.2}Co_{0.2}O_2$ (NMC-622), or $LiNi_{0.8}Mn_{0.1}Co_{0.1}O_2$ (NMC-811) can be produced by supplementing the used solid feedstock with different proportions of lithium, nickel, manganese, and cobalt.

Some advantages of the disclosed embodiments include the ability to tailor the solid precursor chemistry and final particle morphology. Use of the plasma system also enables the use of precursor materials (i.e., NMC powder) that are impractical or impossible to directly utilize in conventional recycling operations without breaking the material down into constituent elements. The process also allows the incorporation of additional Li-content at the nano, micro, or molecular scale (in some embodiments more than one) in the used solid feedstock.

For example, newly formed NMCs formed from embodiments of the disclosure can exhibit novel morphological characteristics not seen in traditionally made NMCs. These morphological characteristics include dense/non-porous particles for maximum energy density, network porosity to enable fast ion transport in the liquid phase for high power applications, and engineered particle size and surface produced in a single processing step or with an additional calcination step.

In some embodiments, the network porosity of the NMCs can range from 0-50% (or from about 0 to about 50%), with an absence of network porosity being most desirable. The particle size can be, for example, between 1-50 microns (or between about 1-about 50 microns). Additionally, a composition at the surface of the NMCs can be made different either in terms of the ratios of the primary constituents (Ni, Mn, and Co) or can be a different material entirely. For example, alumina can be used to passivate the surface.

Embodiments of the disclosed methodology also can give precise control over particle size and particle size distribution, which can be used to maximize particle packing for improved energy density. Engineered interconnected internal porosity can be created with the proper selection of used solid feedstock and process conditions, allowing electrolyte access to the interior, and thus decreasing max solid-state diffusion distances, and increasing rate capability.

Moreover, NMCs formed by embodiments of the disclosure may also exhibit well controlled size and size distribution, of what is known in the industry as secondary grain size, ranging from 1-150 microns (or about 1-about 150 microns)+/−10% (or +/−about 10%).

In some embodiments, the size distribution of the newly formed solid precursor can be a d50 of 5-15 μm (or about 5-about 15 μm). In some embodiments, the particles can have d10 of 2 μm (or about 2 μm) and a d90 of 25 μm (or about 25 μm). However, other distributions may be advantageous for specific applications. For example, larger particles, though still in the range of <50 μm d50 (or <about 50 μm) can be advantageous for very low power energy storage applications. Further, smaller particles, such as 2-5 μm d50 (or about 2-about 5 μm) or 0.5-5 μm d50 (or about 0.5-about 5 μm) can be advantageous for very high-power applications.

Additionally, the primary grain size for the NMCs can be modified to be from 10 nm-10 microns (or about 10 nm-about 10 microns). In some embodiments, the primary grain size may be between 100 nm and 10 microns (or between about 100 nm and about 10 microns). In some embodiments, the primary grain size may be between 50 nm and 500 nm (or between about 50 nm and about 500 nm). In some embodiments, the primary grain size may be between 100 nm and 500 nm (or between about 100 nm and about 500 nm).

The surface area of the newly formed solid precursor material can be controlled by both material porosity and particle size distribution. For example, assuming an identical particle size distribution, an increase in either surface or network porosity leads to an increase in surface area. Similarly, when keeping the level of porosity identical, smaller particles will yield a higher surface area. The surface area of newly formed solid precursor material can be tuned within a range of 0.01-15 $m^2/g$ (or about 0.1-about 15 $m^2/g$). In some embodiments, the surface area of newly formed solid precursor material can be tuned within a range of 0.01-15 $m^2/g$ (or about 0.01-about 15 $m^2/g$). Further, the final particle size can be approximately: d50 of 5-15 μm; d10 of 1-2 μm; d90 of 25-40 μm. In some embodiments, the d50 can be 2-5 microns (or about 2 microns-about 5 microns). In some embodiments, the d50 can be 0.5-5 microns (or about 0.5 microns-about 5 microns). Porosity can be modified to tailor the surface area within the desired range. In some embodiments, for NMC materials, low surface area is desired. As such, in some embodiments, process conditions may be altered to achieve a small-surface area NMC material.

Microwave Plasma Apparatus

Figure 2:
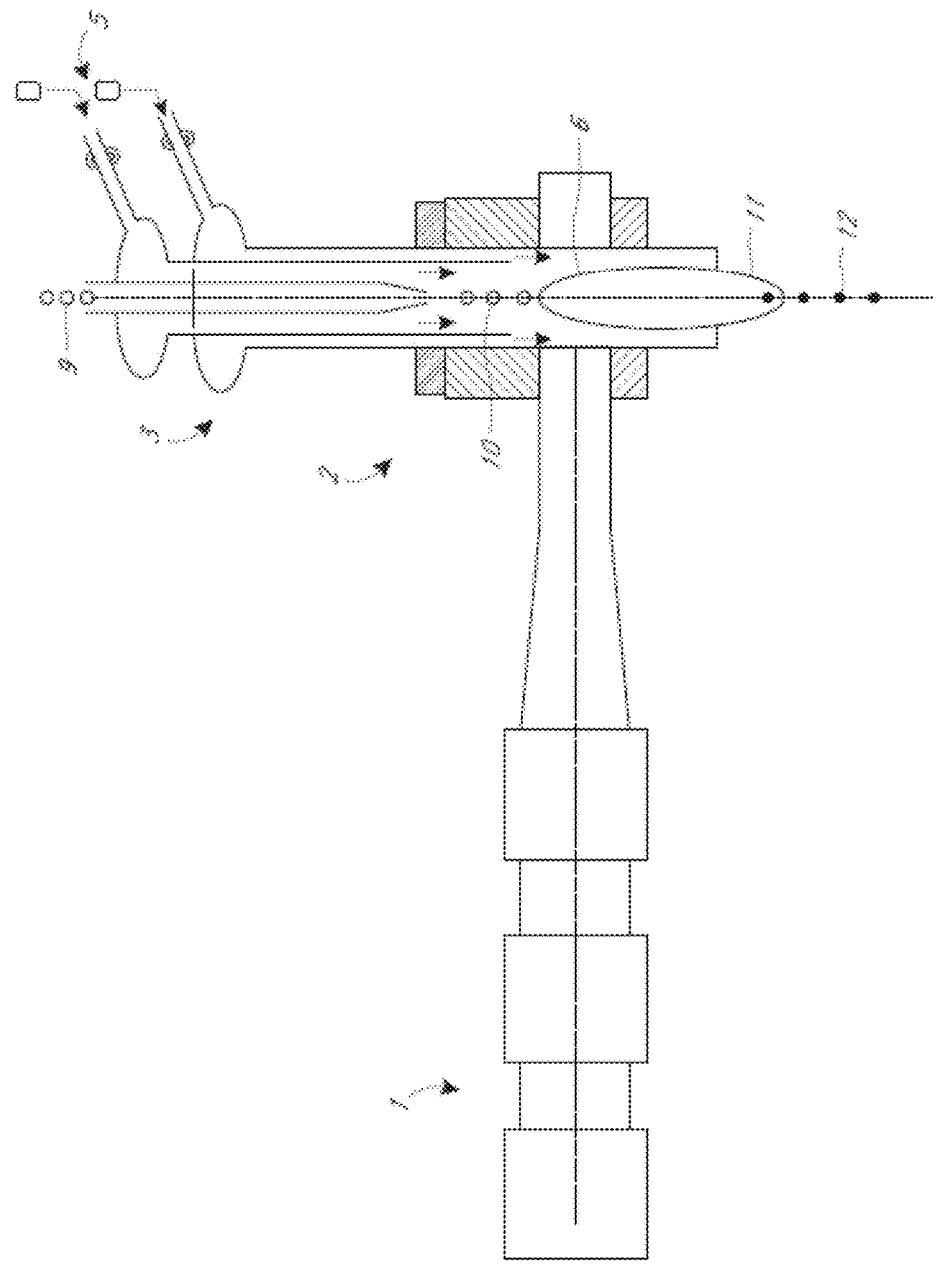
FIG. 2 illustrates an embodiment of a top feeding microwave plasma torch that can be used in the production of recycled solid LIB precursors, according to embodiments of the present disclosure.

FIG. 2 illustrates an embodiment of a top feeding microwave plasma torch 2 that can be used in the production of recycled solid LIB precursors, according to embodiments of the present disclosure. In some embodiments, feed materials 9, 10 can be introduced into a microwave plasma torch 3, which sustains a microwave-generated plasma 11. In one example embodiment, an entrainment gas flow and a sheath, swirl, or work linear flow (downward arrows) may be injected through inlets 5 to create flow conditions within the plasma torch prior to ignition of the plasma 11 via microwave radiation source 1. The feed materials 9 are introduced axially into the microwave plasma torch 2, where they are entrained by a gas flow that directs the materials toward a hot zone 6 and the plasma 11. The gas flows can consist of a noble gas column of the periodic table, such as helium, neon, argon, etc.

Within the microwave-generated plasma, the feed materials are melted in order to repair any cracks, fissures, or imperfections in the materials. Inlets 5 can be used to introduce process gases to entrain and accelerate particles 9, 10 along axis 12 towards plasma 11. First, particles 9 are accelerated by entrainment using a core laminar or turbulent gas flow (upper set of arrows) created through an annular gap within the plasma torch. A second laminar flow (lower set of arrows) can be created through a second annular gap to provide laminar sheathing for the inside wall of dielectric torch 3 to protect it from melting due to heat radiation from plasma 11. In exemplary embodiments, the laminar flows direct particles 9, 10 toward the plasma 11 along a path as close as possible to axis 12, exposing them to a temperature within the plasma. In some embodiments, suitable flow conditions are present to keep particles 10 from reaching the inner wall of the plasma torch 3 where plasma attachment could take place. Particles 9, 10 are guided by the gas flows towards microwave plasma 11 were each undergoes thermal treatment.

Various parameters of the microwave-generated plasma, as well as particle parameters, may be adjusted in order to achieve desired results. These parameters may include microwave power, feed material size, feed material insertion rate, gas flow rates, plasma temperature, residence time, plasma gas composition, and cooling rates. As discussed above, in this particular embodiment, the gas flows are laminar; however, in alternative embodiments, swirl flows or turbulent flows may be used to direct the feed materials toward the plasma.

Figure 3A:
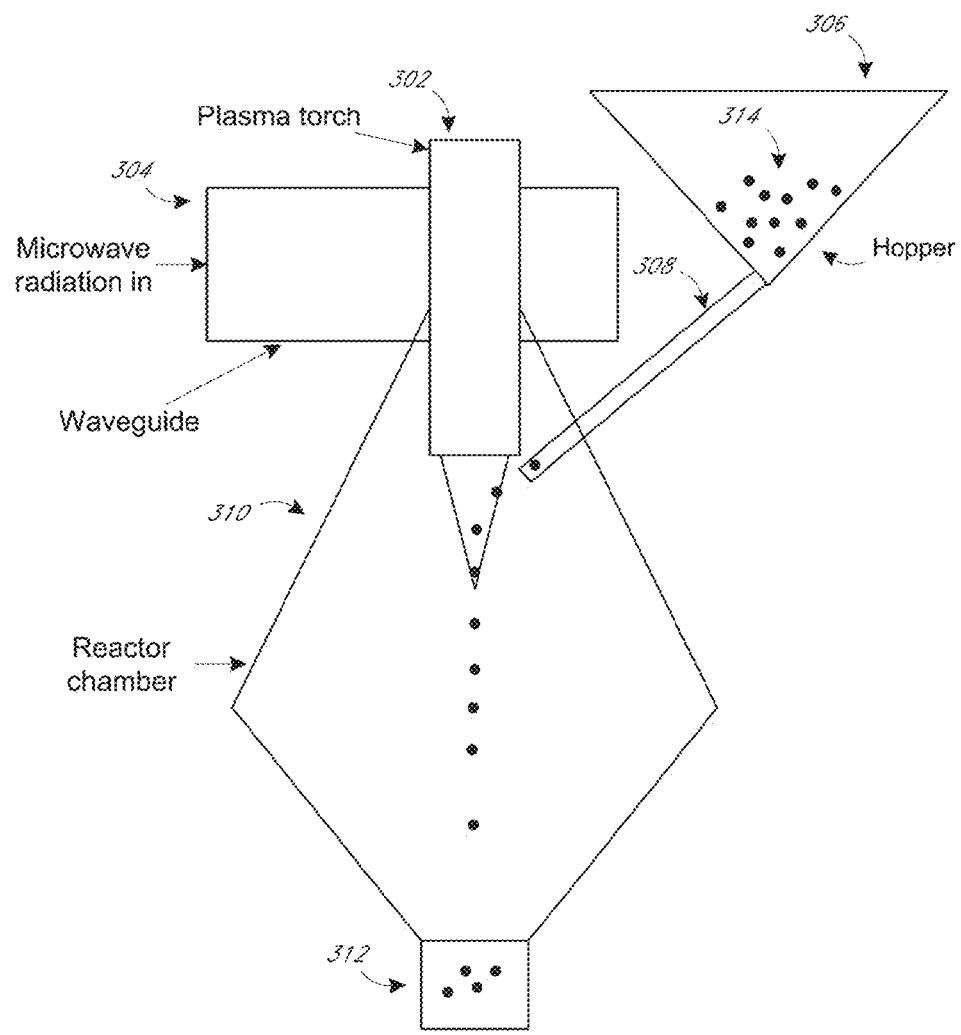
FIGS. 3A-3B illustrate embodiments of a microwave plasma torch that can be used in the production of recycled solid LIB precursors, according to a side feeding hopper embodiment of the present disclosure.
Figure 3B:
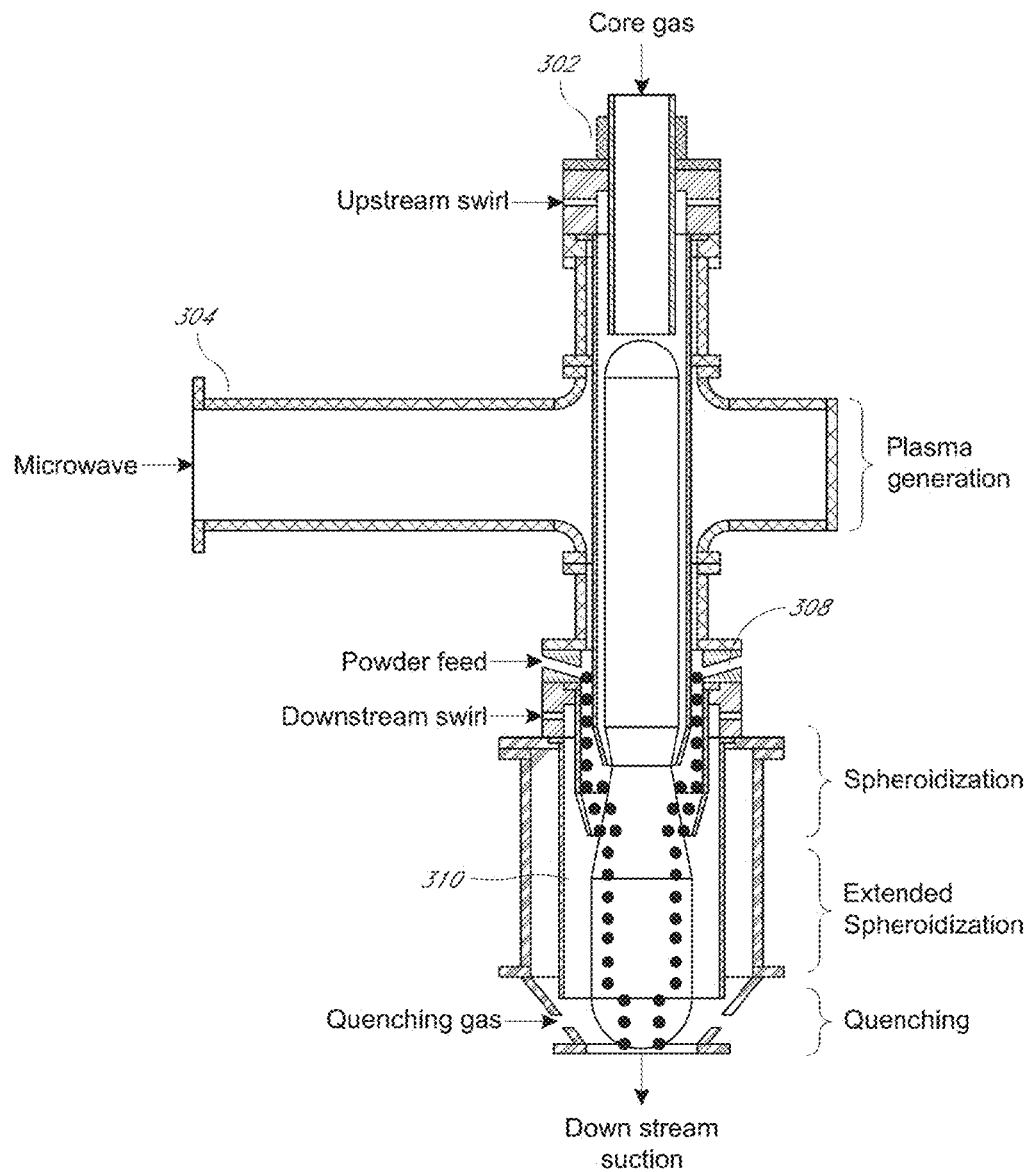

FIGS. 3A-3B illustrate embodiments of a microwave plasma torch that can be used in the production of recycled solid LIB precursors, according to a side feeding hopper embodiment of the present disclosure. Thus, in this implementation, the feedstock is injected after the microwave plasma torch applicator for processing in the "plume" or "exhaust" of the microwave plasma torch. Thus, the plasma of the microwave plasma torch is engaged at the exit end of the plasma torch to allow downstream feeding of the feedstock, as opposed to the top-feeding (or upstream feeding) discussed with respect to FIG. 2. This downstream feeding can advantageously extend the lifetime of the torch as the hot zone is preserved indefinitely from any material deposits on the walls of the hot zone liner. Furthermore, it allows engaging the plasma plume downstream at temperature suitable for optimal melting of powders through precise targeting of temperature level and residence time. For example, there is the ability to dial the length of the plume using microwave power, gas flows, torch type, plasma gas composition, and pressure in the quenching vessel that contains the plasma plume.

Generally, the downstream processing method can utilize two main hardware configurations to establish a stable plasma plume which are: annular torch, such as described in U.S. Pat. Pub. No. 2018/0297122, or swirl torches described in U.S. Pat. Nos. 8,748,785 B2 and 9,932,673 B2, each of which is hereby incorporated by reference in its entirety. Both FIG. 3A and FIG. 3B show embodiments of a method that can be implemented with either an annular torch or a swirl torch. A feed system close-coupled with the plasma plume at the exit of the plasma torch is used to feed powder axisymmetrically to preserve process homogeneity. Other feeding configurations may include one or several individual feeding nozzles surrounding the plasma plume.

The feed materials 314 can be introduced into a microwave plasma torch 302. A hopper 306 can be used to store the feed material 314 before feeding the feed material 314 into the microwave plasma torch 302, plume, or exhaust. In alternative embodiments, the feedstock can be injected along the longitudinal axis of the plasma torch. The microwave radiation can be brought into the plasma torch through a waveguide 304. The feed material 314 is fed into a plasma chamber 310 and is placed into contact with the plasma generated by the plasma torch 302. When in contact with the plasma, plasma plume, or plasma exhaust, the feed material melts or is otherwise altered physically or chemically. While still in the plasma chamber 310, the feed material 314 cools and solidifies before being collected into a container 312. Alternatively, the feed material 314 can exit the plasma chamber 310 while still in a melted phase and cool and solidify outside the plasma chamber. In some embodiments, a quenching chamber may be used, which may or may not use positive pressure. While described separately from FIG. 2, the embodiments of FIGS. 3A-3B are understood to use similar features and conditions to the embodiment of FIG. 2.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one or more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A method for synthesizing lithium nickel manganese cobalt oxide (NMC) powder in a microwave plasma apparatus, the method comprising:
   providing a feedstock to the microwave plasma apparatus, the feedstock comprising end-of-life NMC powder, the end-of-life NMC powder having an average nickel to cobalt ratio of 5:2 or less; and
   introducing the feedstock into a microwave-generated plasma of the microwave plasma apparatus to synthesize an NMC powder having an average nickel to cobalt ratio greater than 5:2.

2. The method of claim 1, further comprising introducing nickel containing material, manganese containing material, or cobalt containing material into the microwave-generated plasma concurrently with introducing the feedstock into the microwave-generated plasma.

3. The method of claim 1, wherein a microstructure of the end-of-life NMC powder comprises one or more imperfections, cracks, or fissures, and wherein introducing the feedstock into the microwave-generated plasma melts the end-of-life NMC powder.

4. The method of claim 3, wherein a microstructure of the synthesized NMC powder does not comprise the one or more imperfections, cracks, or fissures.

5. The method of claim 1, further comprising introducing lithium (Li) containing material into the microwave-generated plasma concurrently introducing the feedstock into the microwave-generated plasma.

6. The method of claim 1, wherein the end-of-life NMC powder comprises NMC-532 or NMC-111.

7. The method of claim 1, further comprising adding lithium (Li) containing material to the feedstock prior to introducing the feedstock into the microwave-generated plasma.

8. The method of claim 1, wherein the end-of-life NMC powder is obtained from a used lithium-ion battery.

9. A method for synthesizing lithium nickel manganese cobalt oxide (NMC) powder in a microwave plasma apparatus, the method comprising:
   providing a feedstock to the microwave plasma apparatus, the feedstock comprising end-of-life NMC powder, the end-of-life NMC powder and having an average nickel to cobalt ratio of 5:2 or less; and introducing the end-of-life NMC powder into a microwave-generated plasma of the microwave plasma apparatus to synthesize an NMC powder, wherein the end-of-life NMC powder is not reduced to its constituent elements prior to introducing the end-of-life NMC powder into the microwave-generated plasma.

10. The method of claim 9, further comprising introducing nickel containing material into the microwave-generated plasma concurrently with introducing the feedstock into the microwave-generated plasma.

11. The method of claim 9, wherein a microstructure of the end-of-life NMC powder comprises one or more imperfections, cracks, or fissures, and wherein introducing the feedstock into the microwave-generated plasma melts the end-of-life NMC powder.

12. The method of claim 11, wherein a microstructure of the synthesized NMC powder does not comprise the one or more imperfections, cracks, or fissures.

13. The method of claim 9, further comprising introducing lithium (Li) containing material into the microwave-generated plasma concurrently introducing the feedstock into the microwave-generated plasma.

14. The method of claim 9, wherein the end-of-life NMC powder comprises NMC-532 or NMC-111.

15. The method of claim 9, further comprising adding lithium (Li) containing material to the feedstock prior to introducing the feedstock into the microwave-generated plasma.

16. The method of claim 9, wherein the end-of-life NMC powder is obtained from a used lithium-ion battery.

* * * * *